US012020969B2

(12) United States Patent
Tamatsukuri et al.

(10) Patent No.: US 12,020,969 B2
(45) Date of Patent: Jun. 25, 2024

(54) ALIGNER AND CORRECTION VALUE CALCULATION METHOD FOR ALIGNER

(71) Applicant: RORZE CORPORATION, Hiroshima (JP)

(72) Inventors: Daigo Tamatsukuri, Hiroshima (JP); Yasuharu Yamamoto, Hiroshima (JP); Katsumi Andoh, Hiroshima (JP)

(73) Assignee: RORZE CORPORATION, Hiroshima (JP)

( * ) Notice: Subject to any disclaimer, the term of this patent is extended or adjusted under 35 U.S.C. 154(b) by 628 days.

(21) Appl. No.: 17/128,199

(22) Filed: Dec. 21, 2020

(65) Prior Publication Data

US 2021/0111055 A1    Apr. 15, 2021

Related U.S. Application Data

(63) Continuation of application No. PCT/JP2019/024519, filed on Jun. 20, 2019.

(30) Foreign Application Priority Data

Jun. 22, 2018    (JP) .................. 2018-118857

(51) Int. Cl.
   *H01L 21/68*    (2006.01)
   *H01L 21/67*    (2006.01)
   *H01L 21/687*   (2006.01)

(52) U.S. Cl.
   CPC ...... *H01L 21/681* (2013.01); *H01L 21/67259* (2013.01); *H01L 21/68707* (2013.01)

(58) Field of Classification Search
   CPC ........ H01L 21/68; H01L 21/681; G03F 7/162
   (Continued)

(56) References Cited

U.S. PATENT DOCUMENTS

2003/0133762 A1    7/2003  Yamamoto et al.
2004/0136000 A1    7/2004  Kurokawa
                   (Continued)

FOREIGN PATENT DOCUMENTS

DE    10349694 A1     5/2004
JP    S6315523 B2 *   4/1988
                     (Continued)

OTHER PUBLICATIONS

Machine translation of JP 2010-052095 (Year: 2010).*
(Continued)

*Primary Examiner* — Steven Whitesell Gordon
(74) *Attorney, Agent, or Firm* — HAUPTMAN HAM, LLP

(57) ABSTRACT

An aligner includes a driving pulley connected to a motor, a toothed belt hung with respect to a driven pulley connected to a spindle, and a pulley detection sensor detecting the rotation position of the driven pulley. Each time the driving pulley rotates the driven pulley once, the misalignment in the direction of rotation of the driven pulley is detected and a correction value of the rotational misalignment of the driven pulley is calculated based on the driving and driven pulleys having a known rotation ratio. In a case where the rotation angle information of the driving motor is lost, detection data for calibration is created so that a correction value corresponding to the current phases of the driven pulley and the toothed belt after origin search is searched for.

13 Claims, 19 Drawing Sheets

(58) Field of Classification Search
USPC .................................. 474/148, 153, 936, 941
See application file for complete search history.

(56) References Cited

U.S. PATENT DOCUMENTS

| | | | |
|---|---|---|---|
| 2007/0126837 A1* | 6/2007 | Takahashi .............. | B41J 11/007 347/104 |
| 2013/0195586 A1* | 8/2013 | Furuichi ............... | H01L 21/681 156/137 |
| 2015/0202774 A1 | 7/2015 | Blank et al. | |

FOREIGN PATENT DOCUMENTS

| | | | | |
|---|---|---|---|---|
| JP | S63292014 | A | * | 11/1988 |
| JP | H6249306 | A | | 9/1994 |
| JP | 2002164419 | A | | 6/2002 |
| JP | 20082664 | A | | 1/2008 |
| JP | 2009109713 | A | | 5/2009 |
| JP | 2010052095 | A | * | 3/2010 |
| JP | 2013157462 | A | | 8/2013 |
| TW | 201542332 | A | | 11/2015 |

OTHER PUBLICATIONS

Machine translation of JP S63-15523 (Year: 1988).*
Machine translation of JP S63-292014 (Year: 1988).*
International Search Report in PCT Application No. PCT/JP2019/024519, dated Sep. 3, 2019, 3pp.
Extended European Search Report in EP Application No. 19822985.8, dated Jan. 25, 2022, 7pp.

* cited by examiner

FIG. 11

| NUMBER OF ROTATIONS OF DRIVING PULLEY 10 | AMOUNT OF TOOTH EXTENSION OF DRIVING PULLEY 10 | POSITION OF REFERENCE TOOTH G1 | NUMBER OF ROTATIONS OF DRIVEN PULLEY 12 | CORRECTION VALUE (PULSE) |
|---|---|---|---|---|
| 0 | 0 | 1 | 0 | 0 |
| 2 | 60 | 61 | 1 | −7 |
| 4 | 120 | 121 | 2 | 10 |
| 6 | 180 | 181 | 3 | 5 |
| 8 | 240 | 42 | 4 | −14 |
| 10 | 300 | 102 | 5 | 1 |
| 12 | 360 | 162 | 6 | 8 |
| 14 | 420 | 23 | 7 | −15 |
| 16 | 480 | 83 | 8 | −7 |
| 18 | 540 | 143 | 9 | 15 |
| 20 | 600 | 4 | 10 | 0 |
| 22 | 660 | 64 | 11 | −9 |
| 24 | 720 | 124 | 12 | 12 |
| 26 | 780 | 184 | 13 | 4 |
| 28 | 840 | 45 | 14 | −10 |
| 30 | 900 | 105 | 15 | 2 |
| 32 | 960 | 165 | 16 | 11 |
| 34 | 1020 | 26 | 17 | −8 |
| 36 | 1080 | 86 | 18 | −3 |
| 38 | 1140 | 146 | 19 | 14 |
| 40 | 1200 | 7 | 20 | 1 |
| 42 | 1260 | 67 | 21 | −5 |
| 44 | 1320 | 127 | 22 | 15 |
| 46 | 1380 | 187 | 23 | 8 |
| 48 | 1440 | 48 | 24 | −10 |
| 50 | 1500 | 108 | 25 | 6 |
| ⋮ | ⋮ | ⋮ | ⋮ | ⋮ |
| 366 | 10980 | 36 | 183 | −12 |
| 368 | 11040 | 96 | 184 | −3 |
| 370 | 11100 | 156 | 185 | 11 |
| 372 | 11160 | 17 | 186 | −10 |
| 374 | 11220 | 77 | 187 | −8 |
| 376 | 11280 | 137 | 188 | 15 |
| 378 | 11340 | 197 | 189 | −1 |
| 380 | 11400 | 58 | 190 | −12 |
| 382 | 11460 | 118 | 191 | 12 |
| 384 | 11520 | 178 | 192 | 6 |
| 386 | 11580 | 39 | 193 | −15 |
| 388 | 11640 | 99 | 194 | −5 |
| 390 | 11700 | 159 | 195 | 11 |
| 392 | 11760 | 20 | 196 | −9 |
| 394 | 11820 | 80 | 197 | −5 |
| 396 | 11880 | 140 | 198 | 13 |
| 398 | 11940 | 1 | 199 | 2 |

FIG. 12

| NUMBER OF ROTATIONS OF DRIVING PULLEY 10 | AMOUNT OF TOOTH EXTENSION OF DRIVING PULLEY 12 | POSITION OF REFERENE TOOTH G1 | NUMBER OF ROTATIONS OF DRIVEN PULLEY 12 | DETECTION VALUE (PULSE) |
|---|---|---|---|---|
| 0 | 0 | 100 | 0 | 1 |
| 6 | 180 | 81 | 3 | 5 |
| 12 | 360 | 62 | 6 | 8 |
| 18 | 540 | 43 | 9 | 15 |
| 24 | 720 | 24 | 12 | 12 |
| 30 | 900 | 5 | 15 | 3 |
| 36 | 1080 | 185 | 18 | -5 |
| 42 | 1260 | 166 | 21 | -6 |
| 48 | 1440 | 147 | 24 | -12 |
| 54 | 1620 | 128 | 27 | -13 |
| 60 | 1800 | 109 | 30 | -1 |
| 66 | 1980 | 90 | 33 | 5 |
| 72 | 2160 | 71 | 36 | 12 |
| 78 | 2340 | 52 | 39 | 14 |
| 84 | 2520 | 33 | 42 | 17 |
| 90 | 2700 | 14 | 45 | 13 |
| 96 | 2880 | 194 | 48 | -1 |
| 102 | 3060 | 175 | 51 | -5 |
| 108 | 3240 | 156 | 54 | -8 |
| 114 | 3420 | 137 | 57 | -11 |
| 120 | 3600 | 118 | 60 | -6 |
| 126 | 3780 | 99 | 63 | 4 |
| 132 | 3960 | 80 | 66 | 8 |
| 138 | 4140 | 61 | 69 | 12 |
| 144 | 4320 | 42 | 72 | 14 |
| 150 | 4500 | 23 | 75 | 14 |

FIG. 17
ACQUISITION AND COMPARISON OF
DETECTION DATA FOR CALIBRATION
SECOND REFERENCE POSITION
DETECTION UNIT 31
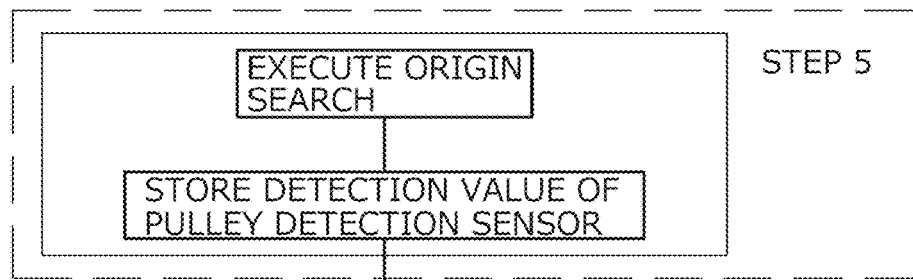
CALIBRATION ROTATION
POSITION DETECTION
UNIT 32
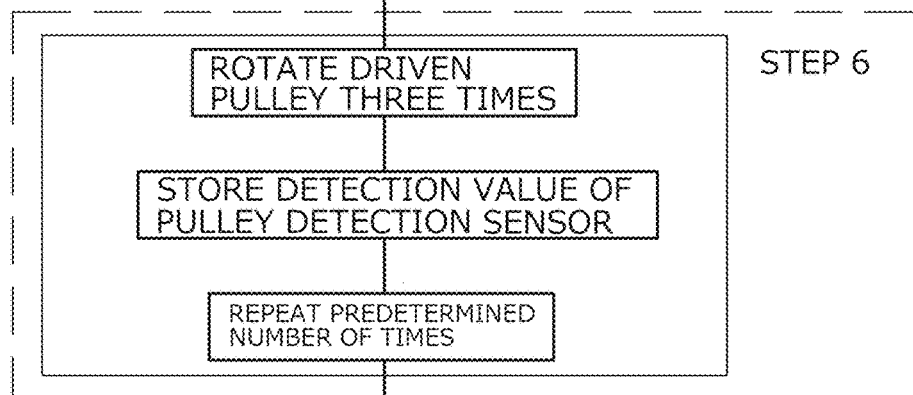
CALIBRATION GRAPH
CREATION UNIT 33
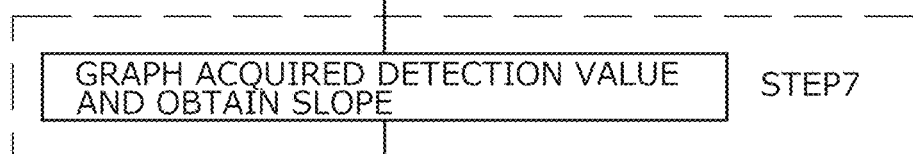
PHASE SPECIFYING
UNIT 34
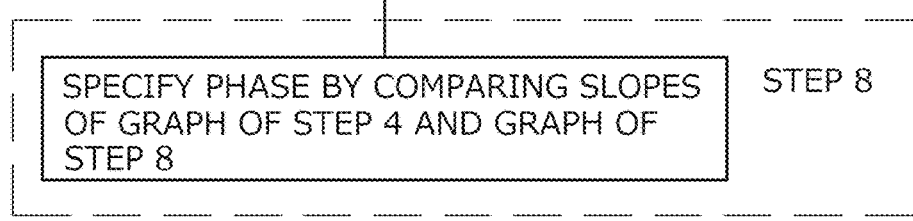

ALIGNER AND CORRECTION VALUE CALCULATION METHOD FOR ALIGNER

RELATED APPLICATIONS

The present application is a continuation of International Application Number PCT/JP2019/024519, filed Jun. 20, 2019, which claims priority from Japanese Application Number 2018-118857, filed Jun. 22, 2018, the disclosures of which applications are hereby incorporated by reference herein in their entirety.

TECHNICAL FIELD

The present invention relates to a technique for improving the alignment accuracy of a wafer aligner on which a semiconductor wafer is placed and the notch or orientation flat formed in the outer peripheral edge portion of the semiconductor wafer is detected for positioning at a predetermined rotation position.

BACKGROUND ART

In a semiconductor device manufacturing process, a plurality of semiconductor wafers as semiconductor device substrates are transported after being stored, in a clean room, in a closed multi-shelf container called a front opening unified pod (FOUP). The semiconductor wafer stored in the FOUP and transported is taken out of the FOUP in a highly clean atmosphere called a mini-environment space and undergoes various processes such as inspection and processing.

In addition, in a process in which semiconductor wafer position information is essential, examples of which include various inspections and processing such as electronic circuit patterning, vapor deposition, and chemical vapor deposition, it is an important pre-stage work to always accurately position the notch portion formed in the outer peripheral edge portion of a semiconductor wafer, such as a notch and orientation flat, and the center point of the semiconductor wafer at predetermined positions. Accordingly, it is necessary to perform delivery to various processing and inspection devices after placing the semiconductor wafer on a wafer positioning device called an aligner, detecting the position of the center point of the semiconductor wafer and the position of the notch portion, and accurately moving the semiconductor wafer to a correct position before the processing, manufacturing, and inspection processes. Further, in recent years, positioning at an accuracy level higher than in the related art has been required from semiconductor wafer circuit pattern miniaturization.

In general, the aligner is formed in a columnar shape and includes a base, a spindle as a wafer mount rotatably disposed on the base, a line sensor disposed at an end of the base and detecting the peripheral edge portion of a semiconductor wafer, and a spindle rotation mechanism rotating the spindle. Further, some aligners are provided with a spindle moving mechanism moving a spindle and a rotary driving unit in X-, Y-, and Z-axis directions. The spindle rotation mechanism is provided with a driving pulley fixed to the output shaft of a motor, a driven pulley attached to a support shaft fixed coaxially with the spindle, and a toothed belt hung around the driving pulley and the driven pulley. In addition, a servomotor or a stepping motor allowing easy driving shaft rotation angle control is used as the motor rotationally driving the spindle. The spindle is a wafer mount on which the semiconductor wafer is placed horizontally. An adsorption hole for adsorbing and holding a wafer W horizontally placed on the spindle is formed in the spindle. The adsorption hole is connected to a vacuum source via a piping member. In the aligner configured as described above, the semiconductor wafer is rotated by the motor with the semiconductor wafer placed on the spindle held and the line sensor measures the peripheral edge portion of the semiconductor wafer. As a result, the amount of deviation of the semiconductor wafer with respect to the spindle rotation center axis is accurately detected.

However, in recent years, semiconductor design rules have become fine and aligners have been required to position semiconductor wafers more accurately than in the related art. Here, a pitch accuracy of the teeth on the toothed belt that does not meet the positioning accuracy required for the aligner is an obstacle to the positioning accuracy improvement. Accordingly, Patent Document 1 discloses a technique for improving positioning accuracy by attaching an encoder coaxially with the support shaft of a spindle and directly detecting the rotation position of the spindle. In addition, a technique for cutting a toothed belt into a plurality of belts and hanging the belts around a pulley with a phase shift so as to cancel periodic fluctuations in the pitch width of the belts as described in Patent Document 2 is disclosed as a method for mitigating misalignment attributable to the pitch width fluctuations of the internal teeth formed on the toothed belt.

CITATION LIST

Patent Document

Patent Document 1: JP 2002-164419 A
Patent Document 2: JP 2013-157462 A

SUMMARY OF THE INVENTION

Problem to be Solved by the Invention

However, although the encoder attachment has led to positional accuracy improvement in the technique described in Patent Document 1 described above, the addition of the encoder to the aligner configuration of the related art has resulted in an increase in manufacturing cost and an increase in device size. Further, although the misalignment attributable to the tooth pitch fluctuations of the toothed belt has been mitigated in the technique described in Patent Document 2, the misalignment has not been eliminated to the extent of meeting the required accuracy.

The invention has been made in view of the above problems, and an object of the invention is to inexpensively provide an aligner calculating a correction value corresponding to each manufacturing error (variation) of the internal teeth formed on a toothed belt and achieving a high level of positioning accuracy even if a toothed belt having a low level of internal tooth pitch accuracy is used. In addition, another object of the invention is to provide a method for acquiring detection data for calibration to which a stored correction value can be applied by specifying the current rotation positions of a pulley and a toothed belt in a short time even in a case where the rotation angle information of a motor driving the toothed belt is lost.

Means for Solving Problem

In order to achieve the above object, the invention provides a correction value calculation method for a wafer positioning device having a motor allowing rotation angle control, a driving pulley driven by the motor, a driven pulley configured at a predetermined rotation ratio with respect to the driving pulley, a toothed belt meshing with the driving pulley and the driven pulley and hung between the driving pulley and the driven pulley, a spindle concentrically fixed to the driven pulley and having fixing means for fixing a semiconductor wafer, an alignment sensor detecting a peripheral edge of the semiconductor wafer fixed on the spindle, a pulley detection sensor detecting a rotation position of the driven pulley, and a control unit, the correction value calculation method being for correcting misalignment in a direction of rotation of the driven pulley attributable to a manufacturing error of the toothed belt and including a reference value storage step of performing origin search by means of the motor, detecting the rotation position of the driven pulley at a time when each of the driving pulley, the driven pulley, and the toothed belt is at a reference position by means of the pulley detection sensor, and storing the detected value in the control unit, a detection value storage step of causing the motor to perform predetermined rotation operation for rotating the driven pulley once and then detecting the rotation position of the driven pulley by means of the pulley detection sensor and storing the detected value in the control unit, and a correction value calculation step of executing the detection value storage step until the driving pulley, the driven pulley, and the toothed belt return to the respective reference positions without exception and calculating the correction value for correcting the misalignment per rotation of the driven pulley in the control unit from the detection value stored in the control unit.

The correction value with respect to each phase of the driving pulley, the driven pulley, and the toothed belt can be calculated by the above method, and thus semiconductor wafer alignment operation can be accurately performed.

Further, the reference detection data acquisition method of the invention includes a reference detection data acquisition step of creating a graph of the detection value calculated by the correction value calculation method of claim 1 and calculating a slope for each predetermined detection range of the graph. In addition, the calibration detection data acquisition method of the invention includes a calibration reference position storage step of performing origin search by operating the motor with rotation angle information lost, detecting the rotation position of the driven pulley after the origin search operation by means of the pulley detection sensor, and storing the detected value in the control unit, a calibration detection value storage step of subsequently causing the motor to perform rotation operation for rotating the driven pulley a predetermined number of times and then repeating the operation of detecting the rotation position of the driven pulley by means of the pulley detection sensor a predetermined number of times and storing in the control unit a calibration detection value detected by the pulley detection sensor each time the rotation operation is performed, a calibration reference detection data acquisition step of creating a graph of the detection value stored in the control unit and calculating a slope for each predetermined detection range of the graph, and a phase specifying step of specifying phases of the driving pulley, the driven pulley, and the toothed belt by comparing the graph created in the reference detection data acquisition step with the graph created in the calibration reference detection data acquisition step.

With the above configuration, the aligner is capable of searching the origin of the motor again and specifying the current phases of the driving pulley, the driven pulley, and the toothed belt even in a case where rotation position information is lost due to power failure, step-out, or the like. Accordingly, the correction value corresponding to the current phase can be found in a short time. As a result, the aligner is capable of resuming accurate positioning operation in a short time.

In addition, in the aligner according to the invention, there is no common divisor other than 1 in the number of the internal teeth formed on the toothed belt, the number of the external teeth formed on the driving pulley, and the number of the external teeth formed on the driven pulley. With the above configuration, the combination of the rotation positions of the driving pulley, the driven pulley, and the toothed belt does not overlap until the number of rotations of the driven pulley becomes equal to the number of the internal teeth of the toothed belt. Accordingly, the correction value for each rotation of the driven pulley can be calculated.

In addition, driving and driven pulleys having various numbers of teeth can be selected and design restrictions are reduced by the number of the internal teeth formed on the toothed belt being a prime number. Further, the number of rotations of the driving pulley required to rotate the driven pulley once can be easily calculated by the number of the external teeth formed on the driven pulley being set to an integer multiple of the number of the external teeth formed on the driving pulley. As a result, the calculation load of the control unit can be reduced.

Effect of the Invention

With the invention, a correction value corresponding to each tooth formed on the toothed belt can be calculated and a high level of positioning accuracy can be achieved even if a toothed belt having a low level of tooth pitch accuracy is used. In addition, even in a case where the rotation angle information of the motor driving the toothed belt is lost, the current phases of the pulley and the toothed belt can be easily specified and detection data for calibration to which the corresponding correction value can be applied can be acquired.

BRIEF DESCRIPTION OF DRAWINGS

FIG. 11 is a table showing the amount of tooth extension and the movement position of a reference tooth G1 of the toothed belt per rotation of the driven pulley;

FIG. 12 is a table showing the amount of tooth extension and the movement position of the reference tooth G1 per three rotations of the driven pulley;

FIG. 17 is a diagram illustrating a procedure for acquiring and comparing detection data for calibration;

MODE(S) FOR CARRYING OUT THE INVENTION

Figure 1:
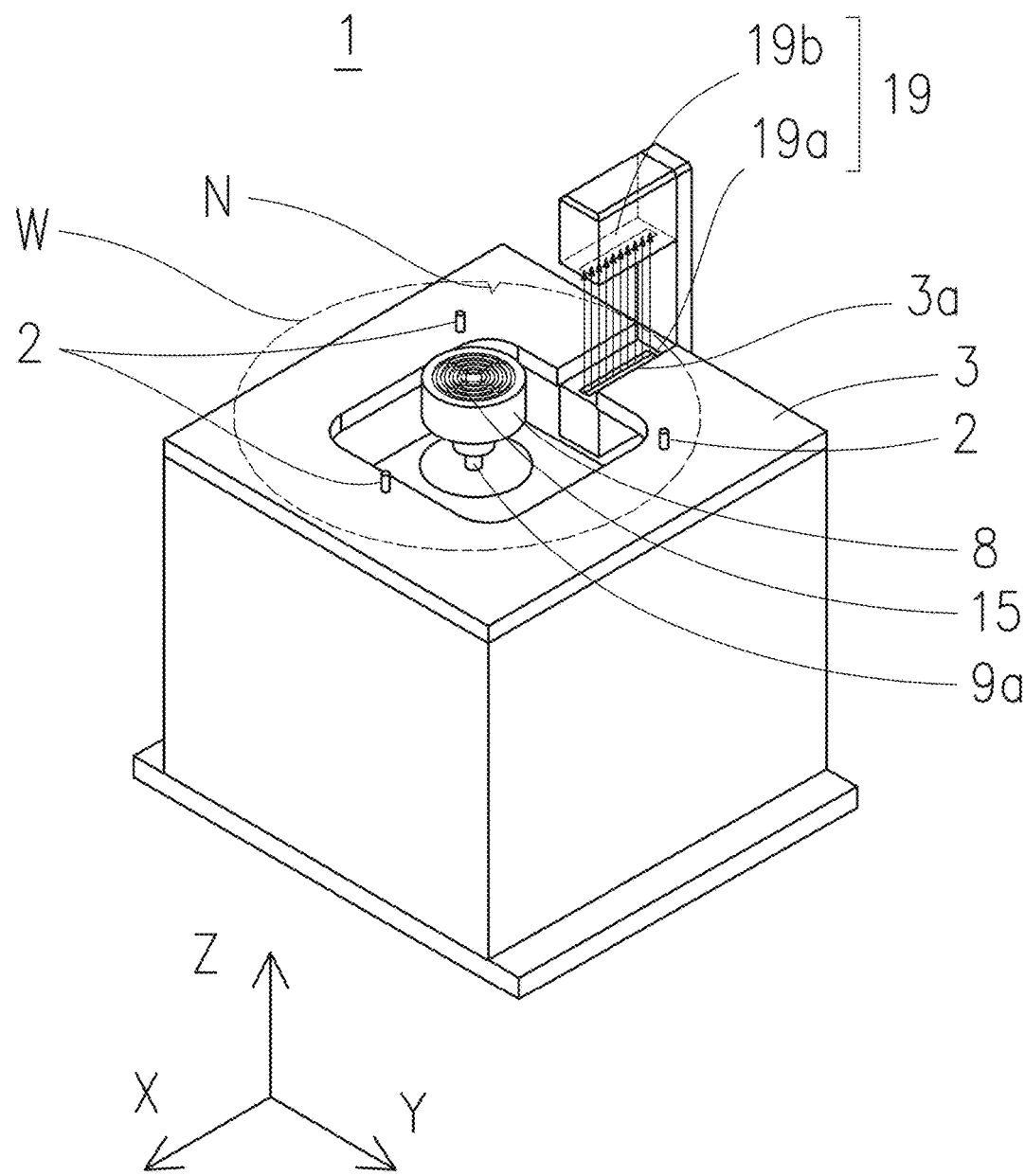
FIG. 1 is a perspective view illustrating an aligner according to one embodiment of the invention.
Figure 2:
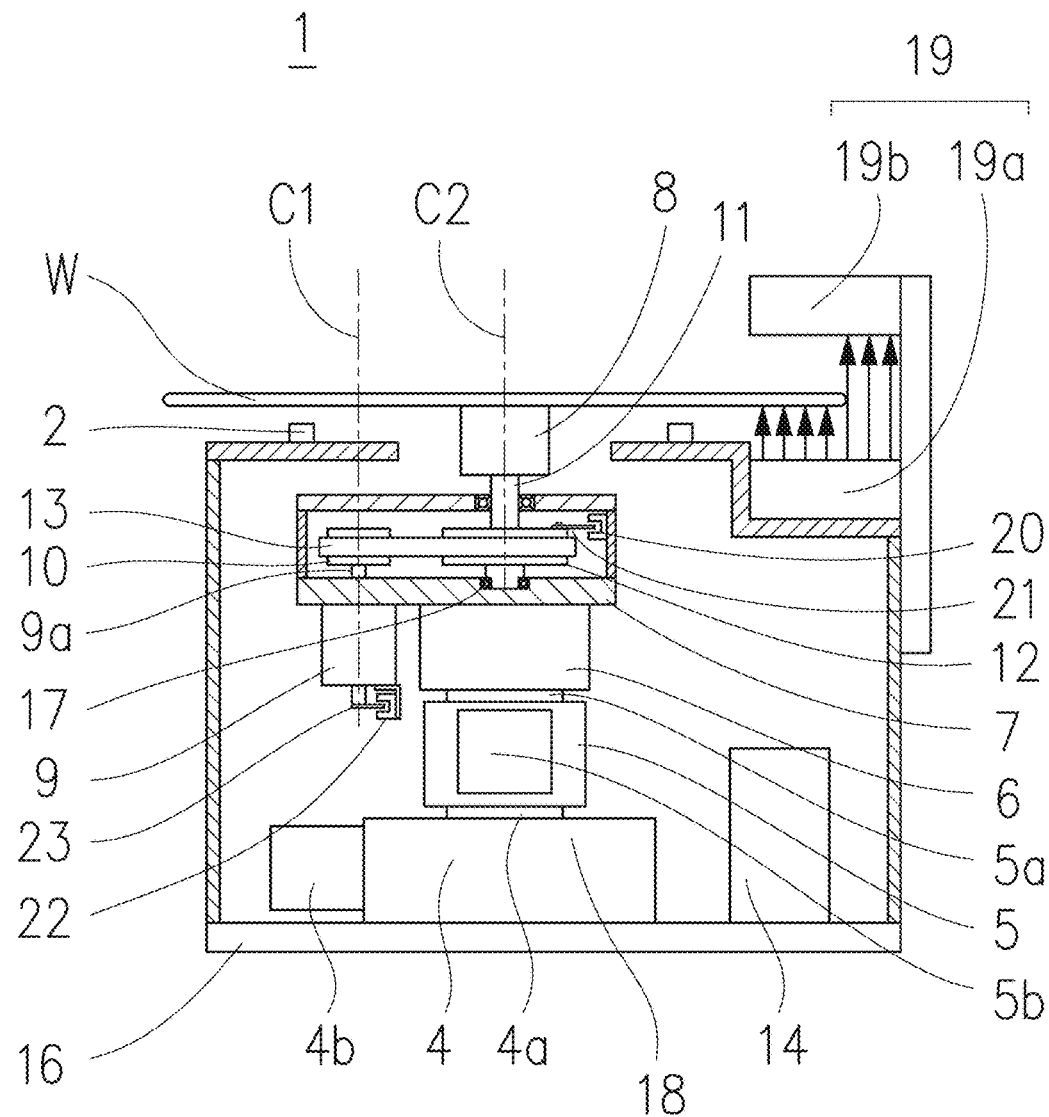
FIG. 2 is a cross-sectional view illustrating the aligner according to one embodiment of the invention.

Hereinafter, an embodiment of the invention will be described in detail with reference to the drawings. FIG. 1 is a perspective view illustrating one embodiment of an aligner 1 of the invention, and FIG. 2 is a partial cross-sectional side view illustrating an internal structural overview with the frame part in FIG. 1 as a cross section. The aligner 1 of the present embodiment is an aligner for detecting the amount of deviation of the position of the center point of a semiconductor wafer W and the position of the notch portion formed at the outer peripheral edge of the wafer such as a notch N and an orientation flat and accurately positioning the semiconductor wafer W at a preset predetermined position. The aligner 1 of the present embodiment is provided with an upper surface plate 3 on which wafer temporary stands 2 are erected and an X-axis driving mechanism 4 and a Y-axis driving mechanism 5 (see FIG. 2) disposed below the upper surface plate 3 and disposed at positions orthogonal to each other. A lifting-lowering mechanism 6 disposed below the upper surface plate 3 can be moved in the XY plane by the X-axis driving mechanism 4 and the Y-axis driving mechanism 5. In addition, a lifting-lowering stand 7 of the lifting-lowering mechanism 6 is provided with a spindle 8 and a spindle driving motor 9 for rotating the semiconductor wafer W placed on the spindle 8 in a horizontal plane. A driving pulley 10 is fixed, coaxially with a rotation center axis C1 of an output shaft 9a, to the vertically extending output shaft 9a of the spindle driving motor 9. In addition, a spindle shaft 11 is coaxially fixed with respect to a center axis C2 of the spindle 8 below the spindle 8 and a driven pulley 12 is fixed coaxially with the spindle 8 and the spindle shaft 11 at the lower end of the spindle shaft 11. The spindle shaft 11 is rotatably supported by the lifting-lowering stand 7 via a bearing 17, and the spindle 8, the spindle shaft 11, and the driven pulley 12 are configured to be integrally rotatable with the vertically extending rotation center axis C2 serving as a rotation center.

Both the driving pulley 10 and the driven pulley 12 are toothed pulleys, and a toothed belt 13 (hereinafter, simply referred to as "belt" as appropriate) is hung between the two pulleys 10 and 12. A motor capable of precisely controlling the rotation angle of the output shaft 9a, such as a stepping motor, is used as the spindle driving motor 9 included in the aligner 1 of the present embodiment, and the operation of the spindle driving motor 9 is controlled by a control unit 14. In addition, the spindle 8 included in the aligner 1 of the present embodiment is a wafer holding base holding the wafer W horizontally. An adsorption hole 15 for adsorbing and holding the wafer W horizontally placed on the spindle 8 by vacuum pressure is formed in the spindle 8, and the adsorption hole 15 is connected to a vacuum source (not illustrated) via a piping member. It should be noted that the form of holding the semiconductor wafer W on the spindle 8 is not limited to the vacuum pressure-based method and the form may be a clamp-type holding form in which the peripheral edge portion of the semiconductor wafer W is gripped or another known holding form.

The X-axis driving mechanism 4 fixed to a lower surface plate 16 includes a slide guide (not illustrated) guiding a mover 4a having an upper surface to which the Y-axis driving mechanism 5 is fixed in the X-axis direction, a ball screw mechanism (not illustrated) disposed in parallel to the slide guide and screwed with the mover 4a, and an X-axis driving motor 4b rotating the rotary shaft of the ball screw mechanism extending in the X-axis direction. The Y-axis driving mechanism 5 includes a slide guide (not illustrated) guiding a mover 5a on which the lifting-lowering mechanism 6 is placed in the Y-axis direction, a ball screw mechanism (not illustrated) disposed in parallel to the slide guide and screwed with the mover 5a, and a Y-axis driving motor 5b rotating the rotary shaft of the ball screw mechanism extending in the Y-axis direction. The lifting-lowering mechanism 6 is a mechanism vertically lifting and lowering the lifting-lowering stand 7 to which the spindle driving motor 9 is fixed. The lifting-lowering mechanism 6 includes a known slide guide (not illustrated) guiding the lifting-lowering stand 7 in the Z-axis direction and a known air cylinder disposed in parallel to the slide guide. The air cylinder is connected to an air supply source (not illustrated) via piping, and the telescopic motion of the piston rod of the air cylinder is caused and the lifting-lowering stand 7 is vertically lifted and lowered by a solenoid valve (not illustrated) disposed between both ends the piping being turned ON and OFF. Spindle moving means 18 including the X-axis driving mechanism 4, the Y-axis driving mechanism 5, and the lifting-lowering mechanism 6 allows the spindle 8 to move in the horizontal and vertical directions. It should be noted that a stepping motor capable of precisely controlling the angle of a rotary shaft is used for each of the motors 4b, 5b, and 9 constituting the spindle moving means 18 and the operation of each of the motors 4b, 5b, and 9 is controlled by the control unit 14.

A slit-shaped notched part 3a of the upper surface plate 3 is provided with an alignment sensor 19 so as to sandwich the peripheral portion of the wafer W placed on the spindle 8 from above and below. The alignment sensor 19 is a line sensor having a light projector 19a provided with a plurality of linearly disposed light projecting portions and a light receiver 19b provided with a plurality of light receiving portions linearly disposed at positions corresponding to the light projecting portions. The alignment sensor 19 is disposed so as to face both the lower side and the upper side of the semiconductor wafer W and such that the optical axis of the detection light emitted from the light projector 19a is perpendicular to the direction of rotation of the semiconductor wafer W disposed on the spindle 8. In addition, the plurality of light projecting and receiving portions are disposed so as to match a radial line segment passing through the rotation center of the spindle 8. The alignment sensor 19 measures the amount of eccentricity (amount of deviation) and the direction of eccentricity (direction of deviation) of the center position of the placed semiconductor wafer W with respect to the rotation center axis C2 of the spindle 8.

This can be measured by means of the detection value (light receiving amount) that is detected by the light receiver 19b in a state where the detection light emitted from the light projector 19a is blocked by the outer peripheral edge of the wafer W. The detection value detected by the light receiver 19b is transmitted as an electric signal to the control unit 14 and arithmetically processed by the control unit 14. In general, the semiconductor wafer W is stored in a FOUP. In many cases, the semiconductor wafer W deviates from a predetermined design position and is stored or taken out when the semiconductor wafer W is taken out by a transfer robot. In this regard, the aligner 1 rotates the semiconductor wafer W held on the spindle 8 to detect the amount of eccentricity and the semiconductor wafer W is temporarily placed on the wafer temporary stand 2 such that the actual center point position of the semiconductor wafer W is positioned at a predetermined appropriate center position by the control unit 14. Subsequently, the spindle 8 is moved in the horizontal direction such that the center position of the semiconductor wafer W and the center axis of the spindle 8 match and the semiconductor wafer W is changed. Further, the semiconductor wafer W is rotated in the horizontal direction such that the notch N is positioned at a predetermined rotation position.

It should be noted that the aligner 1 of the present embodiment is provided with a driving mechanism moving the spindle 8 in the horizontal direction and the vertical direction and has a configuration in which the spindle 8 is capable of changing the semiconductor wafer W after the misalignment of the semiconductor wafer W is detected as described above. However, the invention is not limited thereto and the invention is sufficiently applicable even to a single axis control-type aligner including only a mechanism rotating the spindle 8 without including the spindle moving means 18 such as the X-axis driving mechanism 4, the Y-axis driving mechanism 5, and the lifting-lowering mechanism 6 moving the spindle 8 in the horizontal direction. In this case, the detected information on the angular deviation and the amount of misalignment from the center point of the semiconductor wafer W is transmitted to the wafer transfer robot and, when the wafer transfer robot holds the semiconductor wafer W with a wafer hand, the misalignment of the semiconductor wafer W is corrected by the semiconductor wafer W being held after the wafer hand is moved to a position where the amount of misalignment is canceled.

Figure 5:
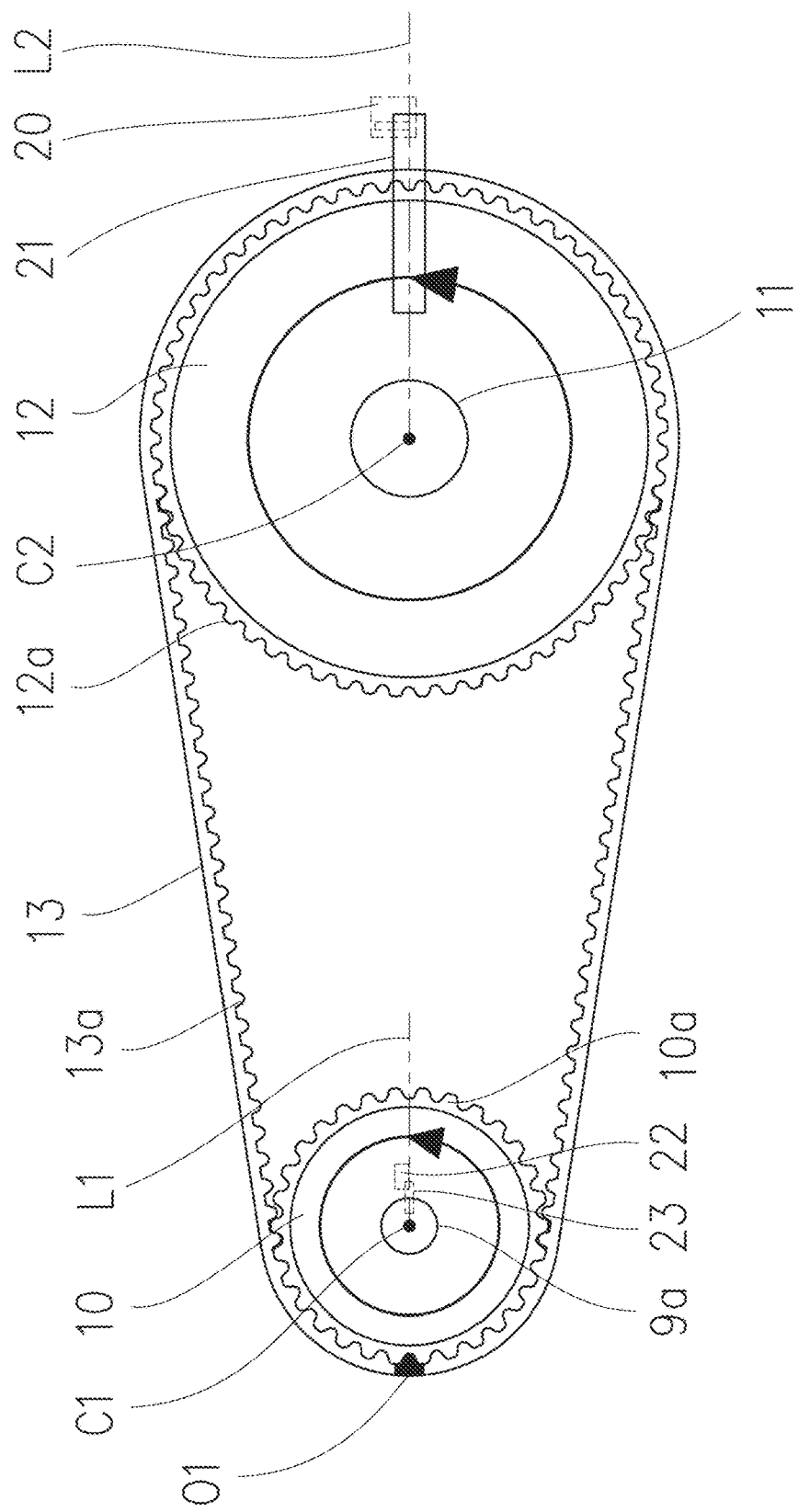
FIG. 5 is a diagram illustrating the rotary driving part of the aligner of the present embodiment.

FIG. 5 illustrates an example of the rotational driving mechanism of the aligner 1 and is a schematic diagram illustrating the driving pulley 10, the driven pulley 12, and the belt 13 provided in the aligner 1 of the present embodiment. External teeth 10a are formed at a predetermined pitch on the outer peripheral portion of the driving pulley 10 fixed to the output shaft 9a. In addition, external teeth 12a having the same shape as the external teeth 10a formed on the driving pulley 10 are formed at a predetermined pitch on the outer peripheral portion of the driven pulley 12 fixed to the spindle shaft 11. In addition, internal teeth 13a meshing with the external teeth 10a and 12a formed on the two pulleys 10 and 12 are formed on the belt 13 hung between the two pulleys 10 and 12. In the above configuration, the rotational driving force of the output shaft 9a of the spindle driving motor 9 is transmitted to the spindle 8 via the driving pulley 10, the belt 13, the driven pulley 12, and the spindle shaft 11.

Figure 3:
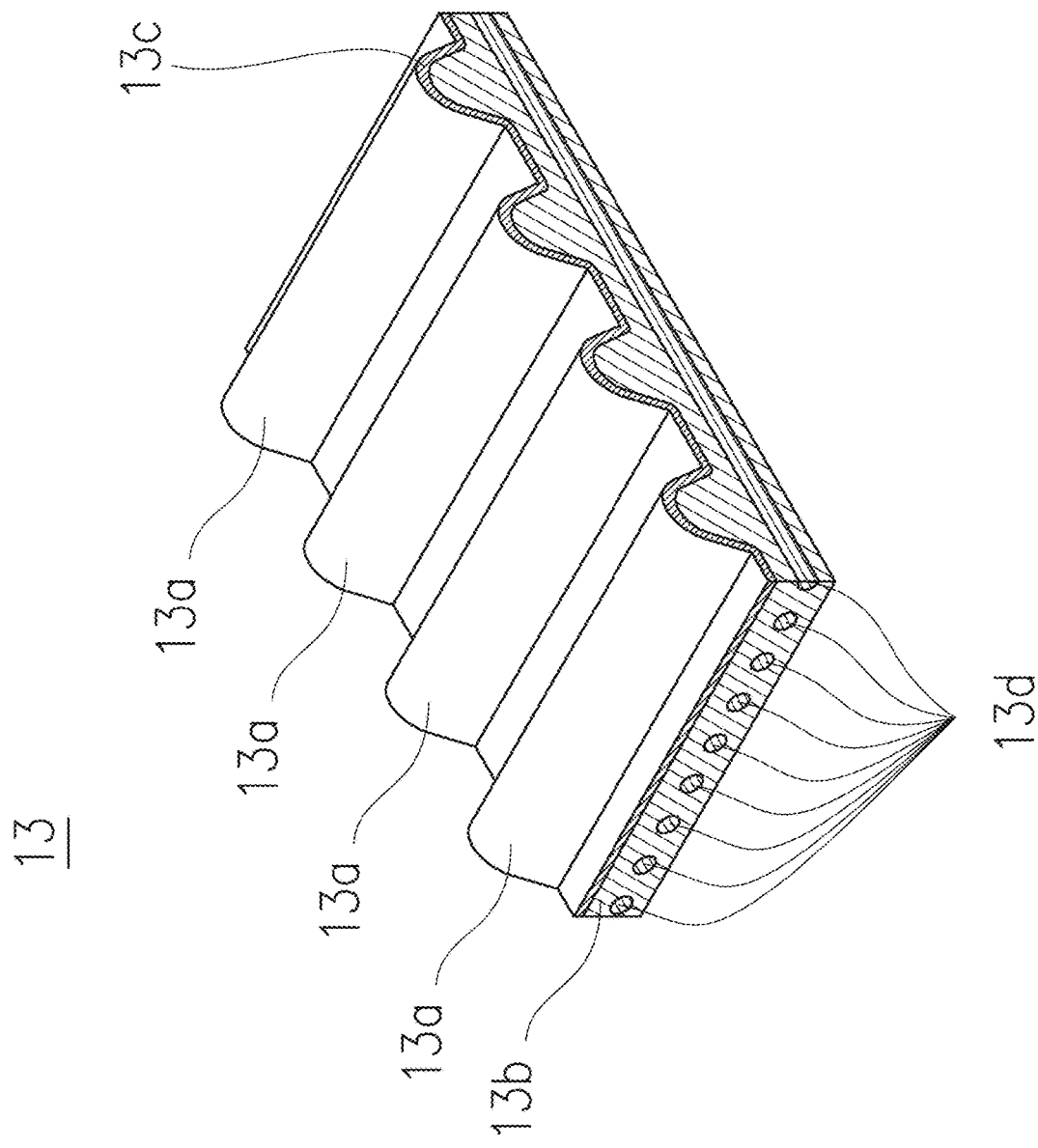
FIG. 3 is a cross-sectional view illustrating an overview of a toothed belt.

FIG. 3 illustrates an example of a cross-sectional view illustrating an overview of the toothed belt 13 applicable to the invention. The belt 13 included in the aligner 1 of the present embodiment is an annular timing belt and is provided with a main body portion 13b where the internal teeth 13a meshing with the external teeth 10a and 12a of the pulleys 10 and 12 are formed, a tooth cloth 13c attached to the surface of the main body portion 13b on which the internal teeth 13a are formed, and a tension body 13d embedded in the main body portion 13b. The main body portion 13b has excellent heat resistance and fatigue resistance and is formed of a relatively lightweight elastomer such as chloroprene rubber. In the main body portion 13b formed of chloroprene rubber, the tension body 13d made of glass fiber, polyamide-based chemical fiber, or the like is embedded along the direction of movement of the belt 13 (circumferential direction). In addition, the tooth cloth 13c for preventing wear is affixed to the surface of the main body portion 13b.

By the way, the belt 13 is molded by the material of the belt 13 such as chloroprene rubber being poured into a space formed by two cylindrical and concentrically disposed molds having different diameters. A groove having a shape corresponding to the internal teeth 13a of the belt 13 is formed in the mold that is one of the two molds and disposed inside. As for manufacturing procedures, the tooth cloth 13c and the tension body 13d are wound first around the surface of the inside mold, the inside mold is moved to the inner space of the cylindrical outside mold, and then the high-temperature belt material is poured in a pressurized state into the space between the inside mold and the outside mold. Subsequently, cooling and removal from the mold are performed, and then the belt 13 is completed by the cylindrically molded belt material being cut to a predetermined width along the circumferential direction.

Figure 4A:
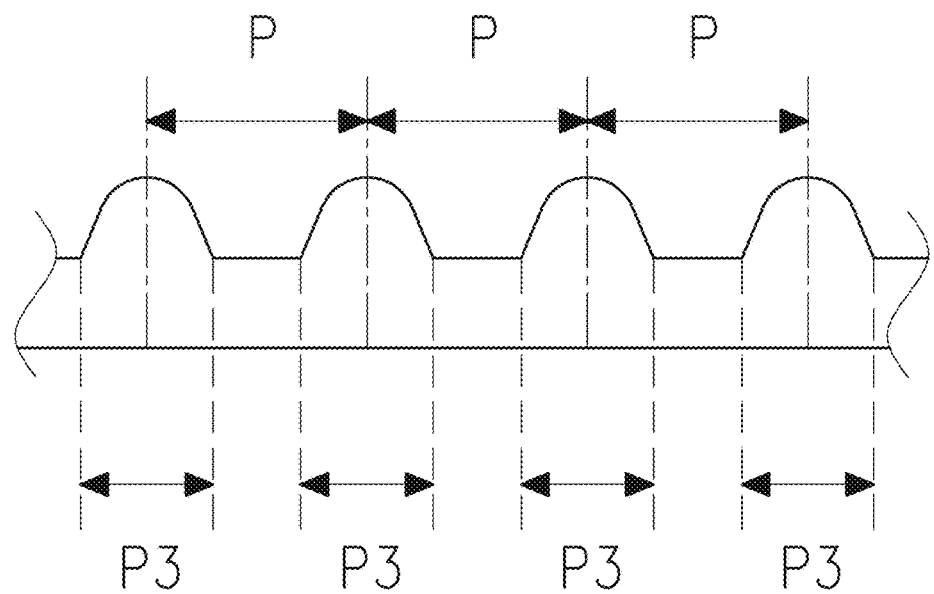
FIGS. 4A and 4B are schematic diagrams illustrating a manufacturing error of the internal teeth of the toothed belt.
Figure 4B:
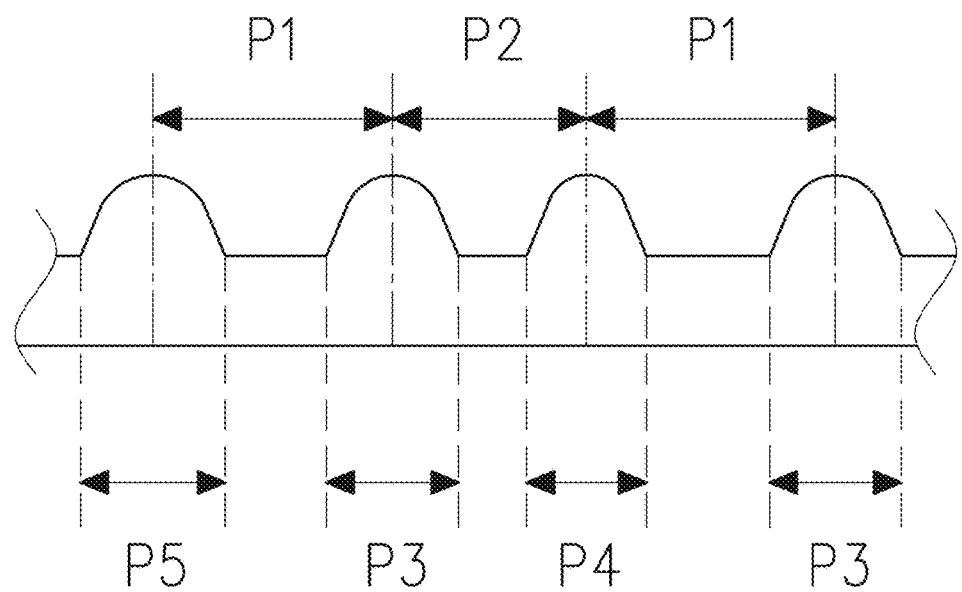

FIGS. 4A and 4B are conceptual diagrams for describing a manufacturing error of the internal teeth of the toothed belt, FIG. 4A illustrates a case where molding has been performed at an even pitch P, and FIG. 4B illustrates a case where the pitch is not uniform. Backlash-less driving force transmission can be easily performed by the belt 13 manufactured in the above process being hung between the driving pulley 10 and the driven pulley 12 after mounting tension adjustment to an appropriate level. However, the internal teeth 13a of the belt 13 are not molded to the same size due to post-molding shrinkage, uneven belt material processing, or the like and the pitch of the internal teeth 13a may become a dimension P1 larger than a specified dimension of even pitch P or a dimension P2 smaller than the specified dimension of even pitch P. Further, the size of each internal tooth 13a becomes a dimension P4 smaller than a specified size P3 or a dimension P5 larger than the specified size P3 to result in a minute pitch error. In addition, a minute pitch error of the belt 13 also arises from the non-uniformity of the elastic modulus of the tension body 13d made of chemical fiber or the like. The rotation of the driving pulley 10 is not accurately transmitted to the driven pulley 12 due to the minute pitch error of the internal teeth 13a, and the rotation of the driven pulley 12 may become uneven with respect to the rotation of the driving pulley 10. When the peripheral edge of the semiconductor wafer W is measured in particular, this deviation results in a trouble that the required alignment accuracy cannot be satisfied.

30 external teeth 10a are formed at an even pitch on the outer periphery of the driving pulley 10 included in the aligner 1 of the present embodiment, and 60 external teeth 12a are formed at an even pitch on the outer periphery of the driven pulley 12. Here, the driven pulley 12 rotates exactly once when the driving pulley 10 rotates twice in a case where the internal teeth 13a formed on the belt 13 are molded at the even pitch P as in FIG. 4A. However, in a case where the shape or pitch of the internal teeth 13a of the belt 13 is ununiform as in FIG. 4B, the rotation of the driving pulley 10 is not accurately transmitted to the driven pulley 12 and the driven pulley 12, the spindle 8, and eventually the semiconductor wafer W held on the spindle 8 do not move to an accurate rotation position corresponding to the rotation of the driving pulley 10.

In this regard, the inventor of the invention has found a method for eliminating, by means of a simple configuration, the low positioning accuracy of the semiconductor wafer W attributable to the manufacturing error of the belt 13. In the method found by the inventor, the rotational unevenness (rotational deviation) of the driven pulley 12 that results from the belt 13 is detected by a sensor every time the driven pulley 12 rotates once and the amount of rotational misalignment of the driven pulley 12 with respect to a reference position (described later) is calculated from the detected value. Then, when the semiconductor wafer W is aligned, the semiconductor wafer W is accurately positioned by a correction value that corresponds to the amount of misalignment per rotation of the driven pulley 12 being applied. Further, even in a case where the rotation angle information (pulse information) of the spindle driving motor 9 is lost due to power interruption or the like, it is possible to return within a short time to the original state where the correction value can be used by comparing the rotational deviation of the driving pulley 10, the driven pulley 12, and the belt 13 at that time with the initially detected detection value (rotational deviation) and implementing a reference position calibration method applied to the current position. In particular, the method of the invention is more effectively implemented in a case where the driving pulley 10 and the driven pulley 12 are set to a predetermined deceleration ratio and the number of the internal teeth 13a of the belt 13 meshing with the external teeth 10a and 12a formed on the driving pulley 10 and the driven pulley 12 is a prime number.

As exemplified in FIG. 5, the 30 external teeth 10a are formed at a predetermined pitch on the peripheral edge of the driving pulley 10 of the present embodiment and the 60 external teeth 12a are formed at a predetermined pitch on the peripheral edge of the driven pulley 12. In addition, the number of the internal teeth 13a molded at a predetermined pitch on the belt 13 hung around the driving pulley 10 and the driven pulley 12 and meshing with the external teeth 10a and 12a is 199, which is a prime number. When the driving pulley 10 rotates twice in the above configuration, the rotation causes the belt 13 to go around by 60 teeth and the driven pulley 12 rotates once as a result.

The driving pulley 10 is fixed on an axis concentric with the rotation center axis C1 of the output shaft 9a of the spindle driving motor 9. A stepping motor capable of precisely controlling the angle of the output shaft 9a is used for the spindle driving motor 9, and it is desirable that the resolution of the spindle driving motor 9 has a high level of accuracy at which, for example, the angle of 0.0225° can be controlled per pulse. Further, a transmitted light-type origin sensor 22 is fixed via a bracket to the lower portion of the spindle driving motor 9 and an origin dog 23 fixed to the output shaft 9a shades the optical axis of the origin sensor 22. As a result, the control unit 14 is capable of detecting that the output shaft 9a of the spindle driving motor 9 and the driving pulley 10 are at the origin position (see FIG. 5). In addition, a pulley detection sensor 20 detecting the rotation position of the driven pulley 12 is disposed in the vicinity of the driven pulley 12 and a dog 21 for shading the optical axis of the pulley detection sensor 20 is fixed to the upper surface of the driven pulley 12.

In this specification, a state where the driving pulley 22, the belt 13, and the driven pulley 12 are in the state of FIG. 5 will be described as the reference position. In other words, a position satisfying all the conditions that the driving pulley 10 moving in conjunction with the output shaft 9a of the driving motor 9 is stationary at the position where the dog 23 of the driving motor 9 shades the origin sensor 22, a reference tooth G1 of the belt 13 is stationary at an origin position O1 at the left end of the driving pulley 10, and the front half of the dog 21 of the driven pulley 12 has moved to the middle of the pulley detection sensor 20 and half-shading has been performed (see the position in FIG. 6A) is set as the reference position for each of the driving pulley 10, the belt 13, and the driven pulley 12. However, this is an example and a state where the rear half of the dog 21 shades half of the pulley detection sensor 20 or a time when a part of the dog 21 shades a predetermined part of the pulley detection sensor 20 may be set as the reference position of the driven pulley.

Figure 6A:
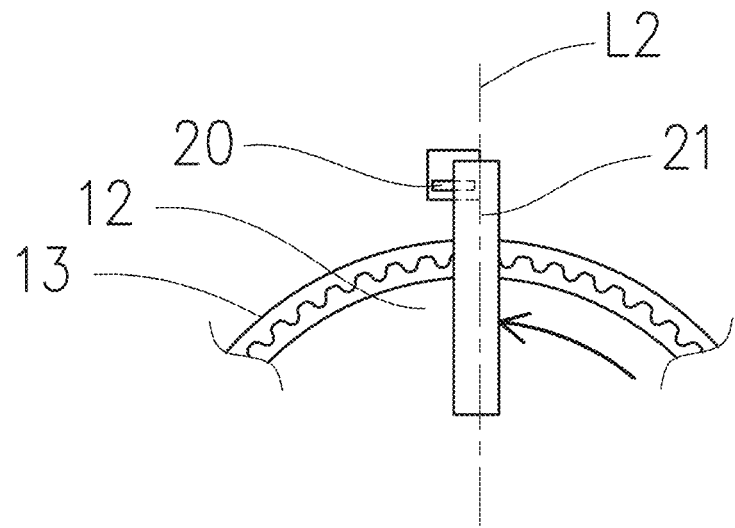
FIGS. 6A to 6C are diagrams illustrating the operation of detecting the position of the driven pulley of the aligner of the present embodiment.
Figure 6B:
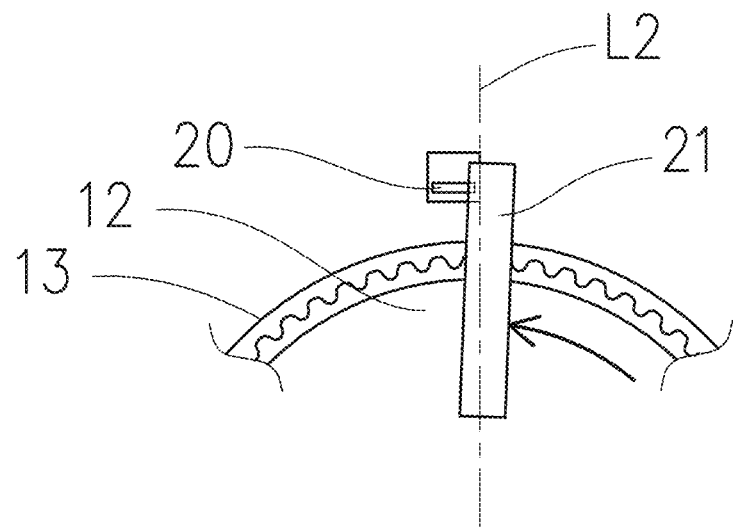
Figure 6C:
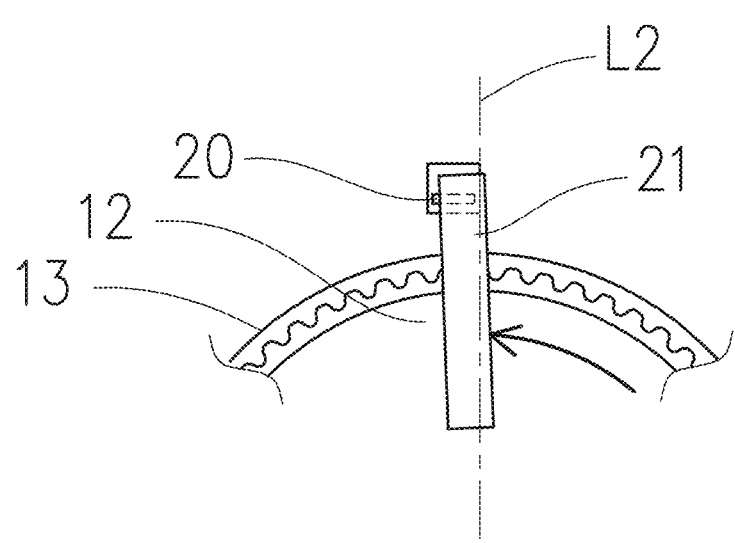

FIGS. 6A, 6B, and 6C are partially enlarged views for describing an example of the pulley detection sensor 20 provided on the peripheral edge side of the driven pulley 12 and various detection states thereof. The pulley detection sensor 20 is a transmitted light-type sensor in which a light receiver detects the detection light emitted from a plurality of light projectors, and the pulley detection sensor 20 detects the rotation position of the driven pulley 12 by the light receiver detecting the light on a plurality of optical axes emitted from the light projectors and shielded by the dog 21. The plurality of light projectors linearly disposed at the pulley detection sensor 20 are disposed such that the optical axis is perpendicular to a line segment L2 radially extending from the rotation center axis C2 of the driven pulley 12.

The pulley detection sensor 20 detects, by means of the light receiver, the light receiving amount that changes depending on the state where the dog 21 blocks the detection light emitted from the light projector and measures the accurate rotation position at a time when the driven pulley 12 has rotated once based on the magnitude (detection value) of the detected light receiving amount. For example, as illustrated in FIG. 6A, the magnitude (detection value) of the light receiving amount is measured with the position where the dog 21 shades those on the front half side among the optical axes arranged in a row serving as the reference position of the driven pulley 12 and the magnitude is stored as the light receiving amount at the reference position. Next, in a case where the driven pulley 12 has stopped slightly ahead of the reference position (on the front side) as in FIG. 6B due to the manufacturing error of the belt 13 when the driven pulley has rotated once, the optical axis (amount of light) shaded by the dog 21 becomes less than half and the light receiver detects a light amount greater than the light receiving amount at the reference position. In addition, in a case where the driven pulley 12 has (gone too far and) stopped behind the reference position as in FIG. 6C, more than half of the optical axis (amount of light) is shaded by the dog 21, and thus the light receiver detects a light amount less than the light receiving amount at the reference position. Accordingly, the amount of deviation of the rotation position of the driven pulley 12 can be recognized based on the magnitude of the detection value by comparison between the detection value at each rotation position and the detection value at the reference position. In other words, it can be seen that the driven pulley has stopped ahead of the reference position in a case where the detection value is large as in FIG. 6B and it can be seen that the driven pulley has gone beyond the reference position and stopped in a case where the detection value is small as in FIG. 6C. It should be noted that how much the reference position is ahead of the driven pulley or how much the reference position is behind the driven pulley can be determined based on the magnitude of the detection value (magnitude of the light receiving amount). The detection value detected by the pulley detection sensor 20 is transmitted as an electric signal to the control unit 14, the control unit 14 calculates the position of the driven pulley 12 from the detection value, and the calculated position is stored in storage means provided in the control unit 14.

First, the acquisition of "reference detection data" during shipment, device installation, or the like will be described with reference to FIGS. 7A and 7B and FIGS. 8A and 8B. "Reference detection data" is detection data for one cycle (set of detection values) or correction value data (set of correction values) calculated based on the detection data, and the cycle is from a time when the driving pulley 10, the belt 13, and the driven pulley 12 are at the reference position to a time when the driving pulley 10, the belt 13, and the driven pulley 12 return to the reference position without exception while the detection value of the pulley detection sensor 20 per rotation is recorded with the driving pulley driven and the driven pulley 12 making one rotation at a time.

Figure 7A:
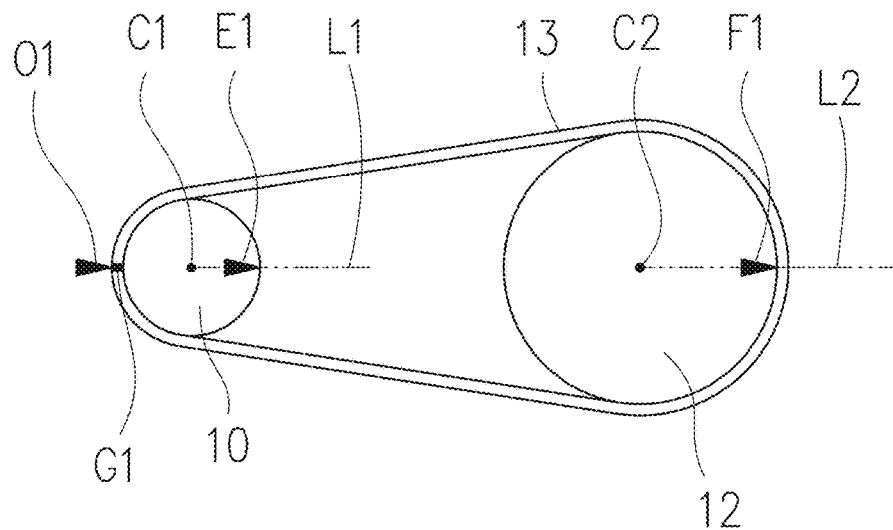
FIGS. 7A and 7B are schematic diagrams illustrating the operation of the aligner of the present embodiment.

FIG. 7A is a diagram illustrating a state where each of the driving pulley 10, the belt 13, and the driven pulley 12 is at the reference position (the same position as in FIG. 5). As for the reference position of the driven pulley 12, it should be noted that the position in the state of FIG. 6A where the pulley detection sensor 20 is half-shielded by the dog 21 as described above is F1 and the position of the dog 23 of the driving pulley in a state where the driving motor is at the origin position is E1 in the following description. In addition, the rotation center C1 of the driving pulley and E1 are interconnected by a line segment L1, the rotation center C2 of the driven pulley and F1 are interconnected by the line segment L2, and the corresponding part of the belt 13 that is stationary at the left end position O1 of the driving pulley 10 at the reference position in FIG. 7A is the reference tooth G1.

Figure 7B:
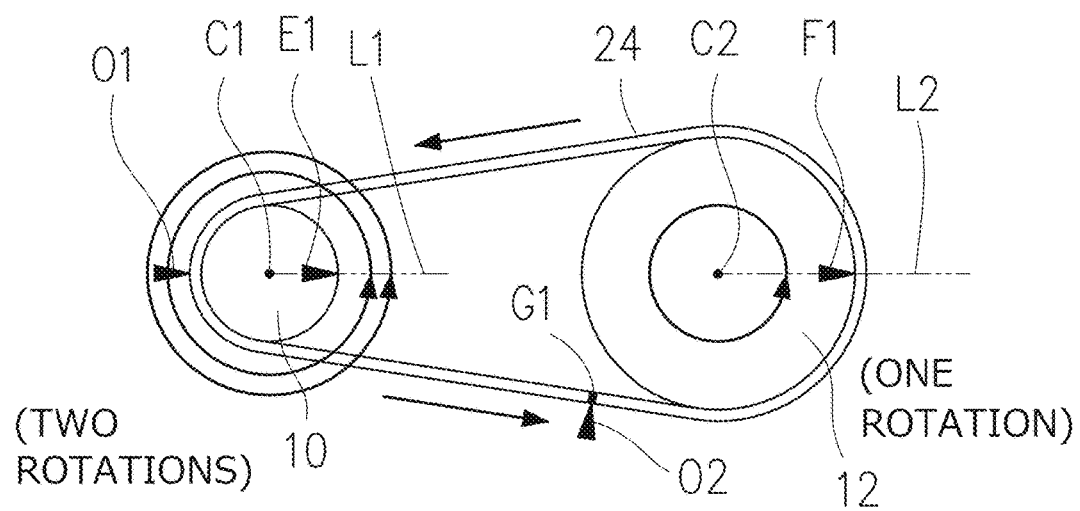

FIG. 7B is a diagram illustrating a position O2 of the reference tooth G1 of a toothed belt 24 and the rotation position of the driven pulley 12 in a case where the driving pulley is rotated twice and the driven pulley 12 is rotated once by means of the manufacturing error-free and ideal toothed belt 24. In a case where the manufacturing error-free toothed belt 24 is used, the rotation of the driving pulley 10 and the driven pulley 12 is free from errors, and thus stopping at the reference position, which is the same position as in FIG. 7A, occurs regardless of the number of rotations. It should be noted that the aligner 1 of the present embodiment described below includes the driving pulley 10 where the 30 external teeth 10a are formed, the driven pulley 12 where the 60 external teeth 12a are formed, and the toothed belt where the 199 internal teeth 13a meshing with the external teeth 10a and 12a are formed. In a case where the ideal toothed belt 24 completely free from manufacturing errors is used, the toothed belt 24 goes around counterclockwise by 60 teeth to the position O2 when the driving pulley 10 rotates twice counterclockwise and rotates to the original reference position E1. In addition, in conjunction therewith, the driven pulley 12 also rotates exactly once counterclockwise and returns to the original reference position F1 indicated by the line segment L2. As a result, no rotation error occurs.

The number of the internal teeth 13a of the toothed belt 24, "199", is a prime number. Accordingly, the reference tooth G1, which is at the origin position O1 during the origin search of the spindle driving motor 9 (driving motor dog detection), stops at 199 stop positions, without overlapping on the round trajectory of the toothed belt 24, every time the driven pulley 12 rotates once until the driven pulley 12 rotates 199 times. Then, when the 199th rotation operation of the driven pulley 12 is completed, the reference tooth G1 of the toothed belt 24 returns to the same origin position O1 as immediately after the origin search. FIG. 11 is a table showing the amount of tooth extension per rotation of the driven pulley 12 and the resultant movement position of the reference tooth G1 of the toothed belt 24. Here, the reference tooth G1, which is initially at the position of O1, moves to the position advanced by 60 teeth every time the driven pulley 12 rotates once, does not stop at the same position while the driven pulley 12 rotates 199 times, and stops at the same reference position only after 199 rotations.

Figure 8A:
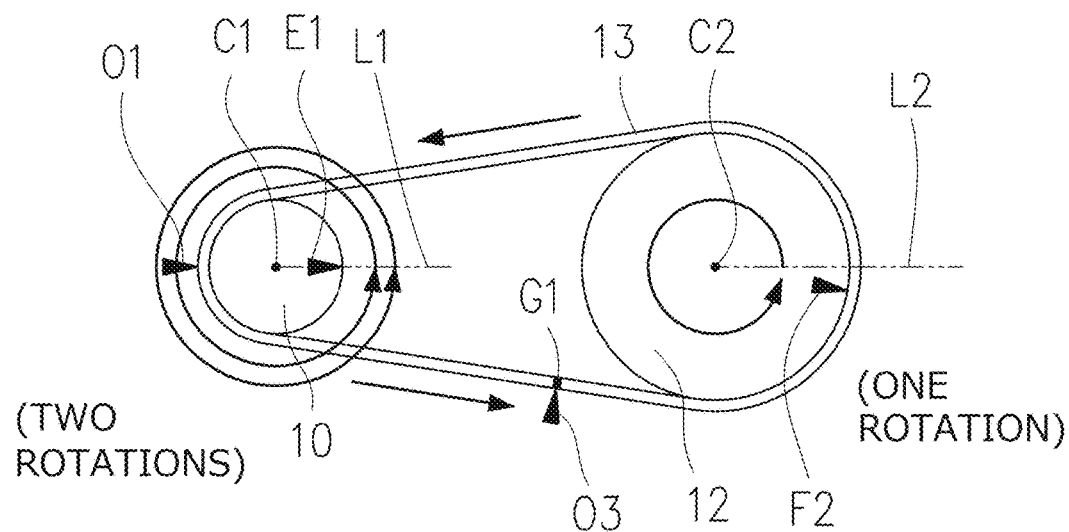
FIGS. 8A and 8B are schematic diagrams illustrating the operation of the aligner of the present embodiment.
Figure 8B:
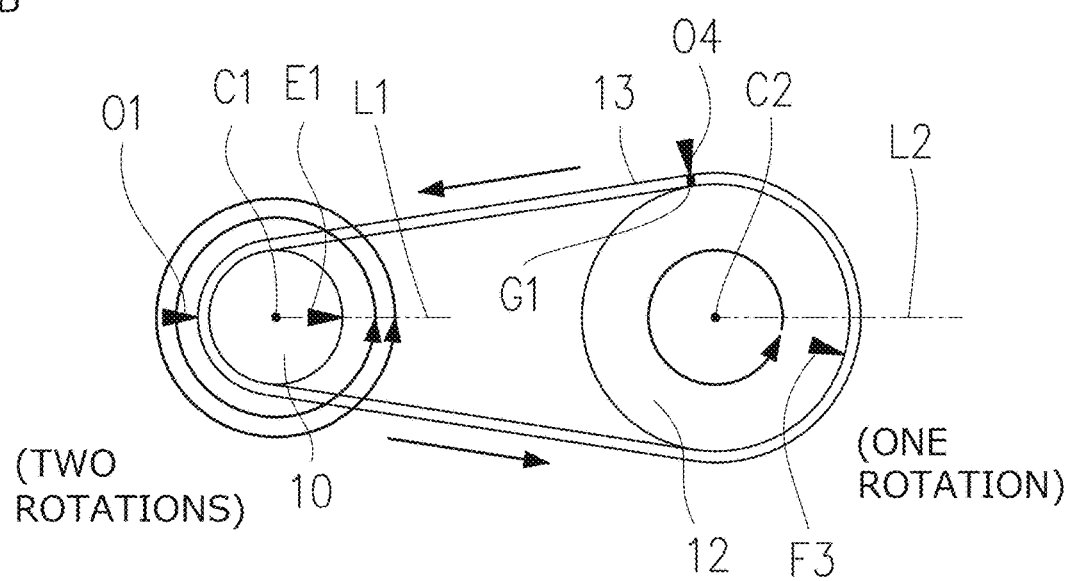

Next, the misalignment of the belt 13 in a case where the belt 13, which is a commonly used toothed belt having a manufacturing error, is used will be described with reference to FIGS. 7A and 7B and FIGS. 8A and 8B. FIGS. 8A, 8B are diagrams for describing a rotation error (rotational unevenness) in a case where the driving pulley 10 is rotated and the driven pulley 12 is rotated by means of the belt 13 having a manufacturing error. FIG. 8A illustrates a state in a case where the driving pulley 10 is rotated twice and the driven pulley is rotated once, and FIG. 8B illustrates a state in a case where the driving pulley 10 is further rotated twice (rotated four times from the origin search). Each internal tooth 13a of the belt 13 has a pitch error and the rotation angle transmission accuracy is low. Accordingly, even when the driving pulley 10 is rotated exactly twice to the reference position E1, G1 of the belt 13 moves to and stops at a position O3, which is slightly deviated from the position O2 (see FIG. 7B) pertaining to a case where the error-free toothed belt 24 is used, as illustrated in FIG. 8A. Accordingly, the driven pulley 12, to which the rotation operation is transmitted by the belt 13 having a manufacturing error, is also incapable of stopping at the initial reference position F1 after one rotation and stops at a position F2, which is slightly deviated from the original rotation position indicated by the line segment L2 (see FIG. 8A). When the driving pulley 10 further rotates twice and the driven pulley is rotated once from this state, the belt 13 further goes around by 60 teeth counterclockwise and moves to a position O4 having an error and the driven pulley 12 rotates to and stops at a position F3, which is deviated from the initial reference position F1, as illustrated in FIG. 8B. It should be noted that the number of the internal teeth 13a of the belt 13 is 199, a prime number, the least common multiple of the number of the external teeth 12a of the driven pulley 12 and the number of the internal teeth of the belt 13 is 11,940, the number of the external teeth of the driving pulley 10 is 30, and thus the driven pulley 12 rotates 199 times by the driving pulley 10 repeating the rotation operation 398 times, the belt 13 having a manufacturing error and the driven pulley 12 return to the original reference positions G1 and F1 illustrated in FIG. 7A, and the same operation in which one cycle is 199 times is repeated. (It should be noted that the driving pulley 10 fixed to the output shaft 9a of the spindle driving motor 9 always returns to the position of E1, without deviating, at every rotation).

The following description is with reference to FIGS. 8A and 8B and FIG. 11. Assuming that the reference tooth G1, which is at the origin position O1 during the origin search of the spindle driving motor 9, is the position of the first internal tooth 13*a* of the belt 13, the reference tooth G1 moves from the position of the first internal tooth 13*a* of the belt 13 to the position of the 61st internal tooth 13*a* when the driving pulley 10 rotates twice counterclockwise and the belt 13 is extended by 60 teeth counterclockwise so that the driven pulley 12 is rotated once counterclockwise. Further, when the driving pulley 10 rotates twice counterclockwise and the belt 13 is extended by 60 teeth counterclockwise, the reference tooth G1 moves from the position of the 61st internal tooth 13*a* of the belt 13 to the position of the 121st internal tooth 13*a*. In this manner, every time the driving pulley 10 rotates twice, the belt 13 is sequentially extended by 60 teeth at a time and the reference tooth G1 moves from the position of the 61st tooth to the position of the 121st tooth, the position of the 181st tooth, and the position of the 42nd tooth. Since the number of the internal teeth 13*a* of the belt 13, 199, is a prime number, the reference tooth G1 sequentially moves to the position of the tooth that is ahead by 60 teeth, that is, from the first tooth to the 61st tooth, from the 61st tooth to the 121st tooth, from the 121st tooth to the 181st tooth, and so on. What is important here is that the movement of the same pattern is not performed until the 199th movement is completed as to the movement pattern of moving from a certain tooth position to the tooth that is ahead by 60 teeth.

In other words, in the configuration of the aligner 1 of the present embodiment, the belt 13 has 199 movement patterns regarding the operation for rotating the driven pulley 12 once. Further, the stop position of the driven pulley 12 after one rotation is deviated from the reference position F1 due to the manufacturing error of the belt 13. Accordingly, every time the movement in each of the 199 movement patterns is completed, the amount of deviation per rotation of the driven pulley 12 is detected by the pulley detection sensor, the correction value is calculated, each movement pattern of the belt 13 is associated with the amount of deviation and the correction value, and the driven pulley 12 is operated so as to accurately move to the reference position F1 in any movement pattern.

The change (deviation) in the rotation position of the driven pulley 12 per rotation that is attributable to the manufacturing error of the belt 13 and arises in the rotation operation of the driven pulley 12 in which one cycle is until the driven pulley 12 returns to the original reference position after rotating 199 times from the reference position is stored as a change in the detection value of the pulley detection sensor 20 every time the driven pulley 12 rotates once. Then, the difference between each detection value and the value detected by the pulley detection sensor 20 at the reference position F1 is obtained for each rotation from the reference position to the 199 rotations and the amount of deviation per rotation of the driven pulley 12 is calculated from the difference. The control unit 14 calculates the correction value for each rotation number of the driving pulley 10 from the difference and stores the correction value. Also, the correction value can be stored alone after the correction value is calculated simultaneously with the acquisition of the detection value of the pulley detection sensor 20. It should be noted that the correction value is desirably calculated as the number of control pulses of the driving motor.

The correction value calculated here is used so that the operation of the spindle driving motor 9 is corrected such that the rotational deviation of the driven pulley is eliminated. Specifically, when the positioning of the semiconductor wafer W and the detection of the notch N are actually performed, the operation of the spindle driving motor 9 is corrected by the stored correction value being applied to the value detected by the alignment sensor 19, and then the driven pulley 12, the spindle 8, and eventually the semiconductor wafer W placed on the spindle 8 can be accurately positioned. In the correction method of the present embodiment, it is assumed that the amount of deviation detected 199 times is the inherent deviation amount of each internal tooth 13*a* of the belt 13, the correction value with respect to the rotational unevenness of the driven pulley 12 resulting from the misalignment of each internal tooth 13*a* of the belt 13 is calculated and saved, and the semiconductor wafer W is accurately positioned by the correction value being applied in accordance with the rotation angle of the spindle driving motor 9.

In other words, in the case of the numbers of teeth of the driven pulley 12 and the belt 13 described above, the detection value of the pulley detection sensor 20 per rotation of the driven pulley 12 is periodically repeated with 199 times serving as one cycle. Accordingly, the difference between the detection value of the pulley detection sensor 20 per rotation of the driven pulley 12 and the detection value at the reference position is plotted in synchronization with the 199 phases in the round movement of the belt 13 in which 199 times is one cycle, it is assumed that the difference is the amount of rotational deviation of the driven pulley 12 with respect to the reference position of each phase, and the correction value with respect to the rotational unevenness of the driven pulley 12 is calculated. It should be noted that this correction value is converted into the pulse number of the pulse-driven spindle driving motor 9 since the rotation angle control of the spindle driving motor 9 is controlled with a pulse value by the control unit 14. The control unit 14 also stores the rotation angle information of the spindle driving motor 9 added with the correction value for each of the 199 phases of the belt 13 (cumulative number of pulses of the stepping motor for each rotation for rotating the driven pulley 199 times: corrected from the deviation amount entailed by the belt error). It should be noted that the phase of the belt 13 here is the rotation position of the belt 13 at a specific timing when the belt 13 performs the round operation (rotation operation) in which the driven pulley is rotated 199 times in one cycle.

The correction value per cycle of the driven pulley 12 with respect to the rotational unevenness of the driven pulley 12 acquired as described above is a correction amount starting from the reference position, and thus it is premised that the reference position, which is the starting point where the correction value is zero, is specified. However, in a case where the aligner is turned off and then turned on again or in a case where the rotation angle information of the driving motor 9 is lost for some reason, the starting point is unknown, and thus the rotational unevenness cannot be corrected by the application of the stored correction value.

Accordingly, it is necessary to find out which position (phase) in one cycle (199 positions) is the position of the driven pulley 12 immediately after power input or the like and synchronize the actual positions of the driving pulley 10, the belt 13, and the driven pulley 12 with the correction value created based on the reference detection data. The origin search is the initial operation that is performed for the synchronization. The dog 21 of the driving motor 9 is detected during the origin search. The position where the dog 21 is detected by the origin search serves as a temporary reference position, and operation almost identical to the operation of reference detection data acquisition during shipment is performed.

The operation for the post-origin search synchronization is almost identical to the operation of reference detection data acquisition, and thus the operation will be described with reference to FIGS. 7A and 7B and FIGS. 8A and 8B. It should be noted that the positions of the driving pulley 10, the belt 13, and the driven pulley 12 immediately after the origin search following power re-input are in the state of FIG. 8A in the following description.

The timing of execution of the origin search is unknown, and thus the position of the driven pulley 12 and the position of the belt 13 immediately after the origin search do not always stop at the reference position at the time of setting during shipment. If the reference tooth G1 is, for example, stationary at the position of O3 in FIG. 8A regarding the stop positions of the reference tooth G1 and the driven pulley 12 immediately after the origin search, the reference tooth G1 moves to the position of O4 when the driving pulley 10 rotates twice and the driven pulley 12 is rotated once next. Then, every time the driving pulley 10 rotates twice, the driven pulley 12 rotates once and the reference tooth G1 sequentially moves to the position that is ahead by 60 teeth. The detection value per rotation of the driven pulley 12 is acquired with the position O3 of the reference tooth G1 after the origin search following the power re-input serving as a temporary reference.

Hereinafter, in a case where the temporary reference data (detection data for calibration) is also acquired, the detection value is acquired from the pulley detection sensor 20 for each rotation in a case where the driven pulley 12 is rotated as illustrated in FIGS. 8A and 8B, the detection value is stored, and the correction value is detected in the same manner as the case of reference detection data acquisition. Then, the place where the change pattern of the correction value in one cycle based on the acquired temporary reference data and the correction value change pattern during shipment match is found, the position of the temporary reference position in one cycle during shipment is specified, and the positions of the driven pulley 12 and the belt 13 after the origin search are synchronized.

A specific synchronization method will be described later.

Figure 18:
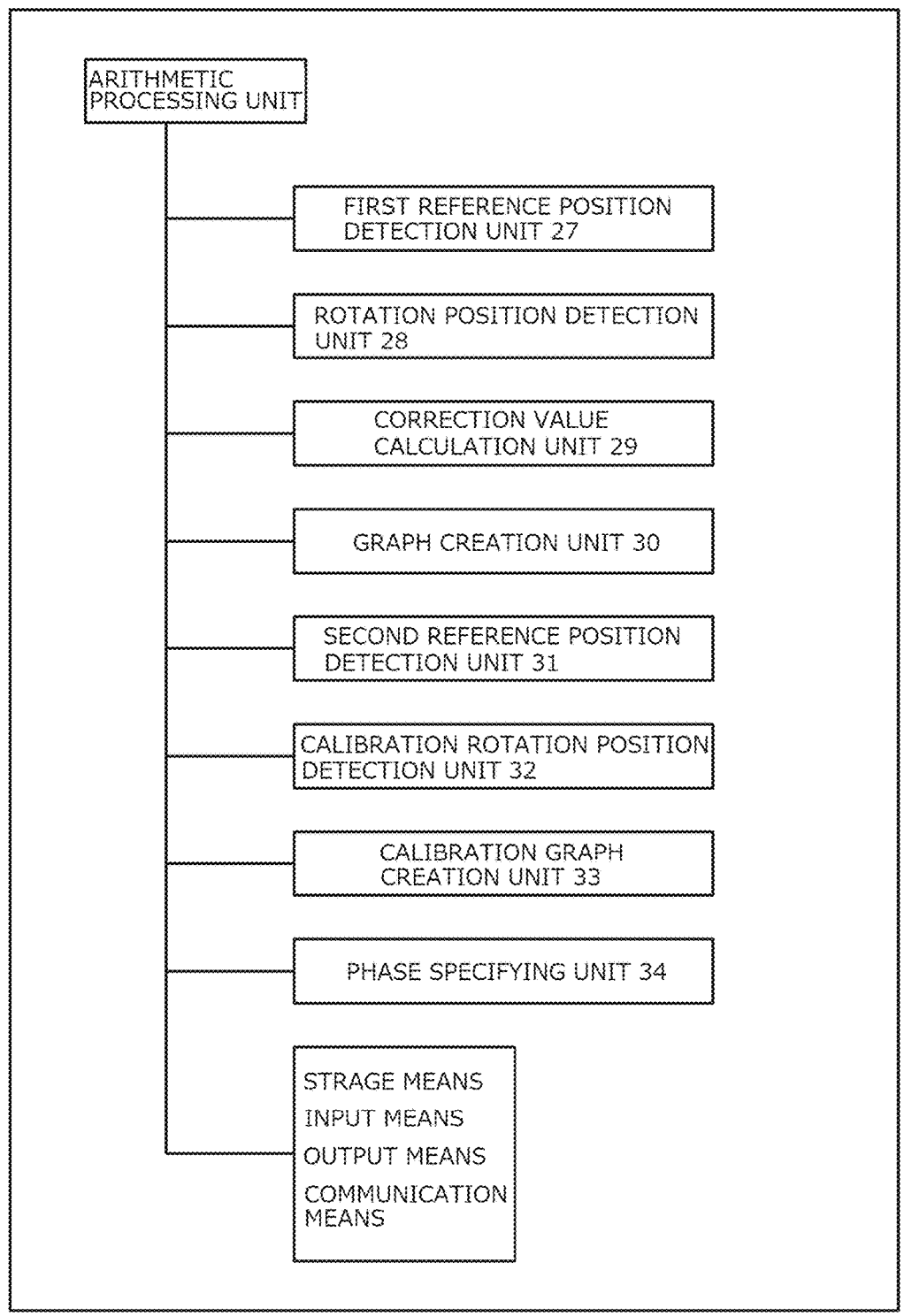
FIG. 18 is a block diagram illustrating the configuration of a control unit 14 according to one embodiment of the invention.

The control unit 14 will be described next. FIG. 18 is a block diagram illustrating the configuration of the control unit 14. The control unit 14 includes a first reference position detection unit 27, a rotation position detection unit 28, a correction value calculation unit 29, a graph creation unit 30, a second reference position detection unit 31, a calibration rotation position detection unit 32, a calibration graph creation unit 33, and a phase specifying unit 34 that perform the rotation position detection operation of the invention. In addition, the control unit 14 includes input means for receiving signals from various sensors, input devices, and the like, output means for transmitting an operation control signal to a motor or the like, storage means for storing an operation program, various data, or the like, and communication means for communicating with a host PC or the like. These operation processes are performed by the arithmetic processing unit included in the control unit 14 in accordance with the operation program pre-stored in the storage means.

Figure 16:
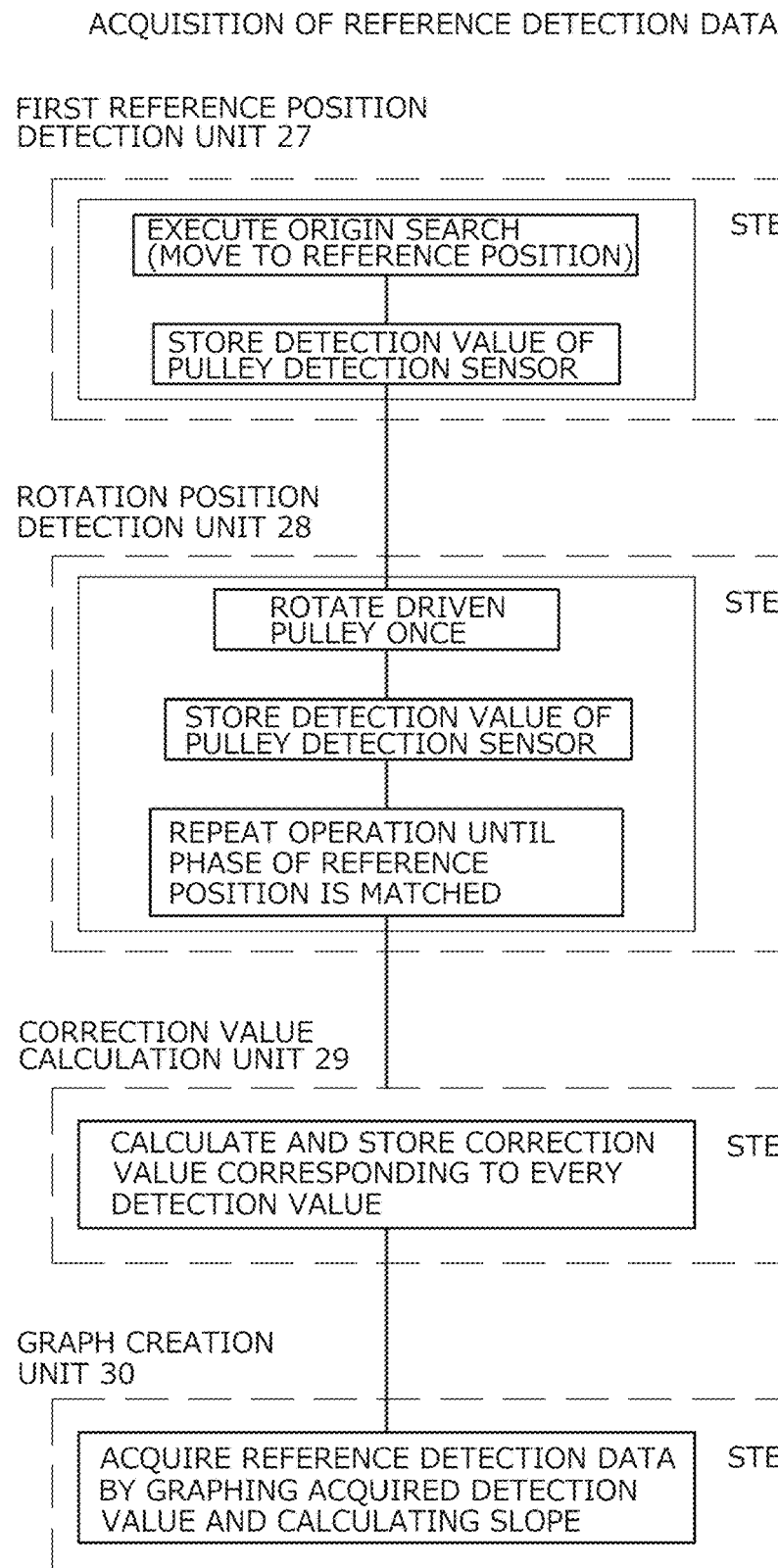
FIG. 16 is a diagram illustrating a reference detection data acquisition procedure.

Next, a procedure for detecting the rotation position of the driven pulley 12 for acquiring the reference detection data serving as a correction value calculation reference will be described. FIG. 16 is a flowchart illustrating the reference detection data acquisition processing procedure. In the following description, the driving pulley 10 (number of teeth: 30), the belt 13 (number of teeth: 199), and the driven pulley 12 (number of teeth: 60) of the present embodiment are used. After the aligner 1 is turned on, the first reference position detection unit 27 performs the origin search by operating the spindle driving motor 9. As a result, the detection value of the pulley detection sensor 20 immediately after the origin search is stored as the detection value (origin reference data) at the reference position of the driven pulley 12 (reference value storage step: Step 1). Next, the rotation position detection unit 28 rotates the driven pulley 12 once by rotating the driving pulley 10 exactly twice. As a result, the detection value of the pulley detection sensor 20 immediately after the driven pulley 12 is rotated once is stored. The rotation position detection unit 28 repeats the same double rotation operation of the driving pulley 10 and the detection by the pulley detection sensor 20 until the driven pulley 12 rotates 199 times and stores the 199 detection values without exception (detection value storage step: Step 2). It should be noted that the detection operation is performed 199 times since the 199 internal teeth 13*a* of the belt 13 are molded in the aligner 1 of the present embodiment and yet the invention is not limited to this number. In short, the detection operation is performed until each of the driving pulley 10, the driven pulley 12, and the belt 13 returns to the same phase (same position) as at the reference position.

When the driving pulley 10, the driven pulley 12, and the belt 13 return to the reference position by the rotation operation of the driven pulley 12 being repeated, the correction value calculation unit 29 calculates the correction value corresponding to each of the detection values for the 199 rotations of the driven pulley 12 from the detected detection value and stores the correction value (correction value calculation step: Step 3). The origin reference data can be compared with the detection value of the pulley detection sensor 20 at each rotation position of the driven pulley 12, and the difference of the detection value can be stored as the correction value. In addition, the difference of the detection value can be converted into the step pulse amount of the spindle driving motor 9 and stored. By a table being prepared in advance as to the amount of change in the detection value of the pulley detection sensor 20 based on the amount of deviation of the driven pulley 12 and the pulse number of the spindle driving motor 9 corresponding to the amount of deviation, the difference of the detection value of the pulley detection sensor 20 can be converted as the step number of the spindle driving motor 9.

It should be noted that the rotation position detection unit 28 desirably stores the corrected rotation angle information of the spindle driving motor 9 per rotation of the driven pulley 12 for one cycle and as control information of the spindle driving motor 9 (stores the cumulative step number for each phase in order to rotate the driven pulley 12 by one cycle (199 rotations)).

The detection data acquired as described above (such as the correction value or the detection value for one cycle) is sorted such that the position numbers of the internal teeth 13*a* are in ascending order and is turned into a graph in which the horizontal axis represents the position number of the internal tooth 13*a* to which the reference tooth G1 has moved and the vertical axis represents the detection or correction value. In addition, graphing can be performed by an approximate straight line of the graph being obtained from the graph (reference detection data acquisition step: Step 4). It should be noted that the position numbers of the internal teeth 13*a* on the horizontal axis are sorted in ascending order in the data to be graphed. As a result, the created graph has a waveform similar to a sine wave and it becomes easy to specify the slope of the graph at a time when, for example, the approximate straight line is obtained.

As described above, in the present embodiment, the belt 13 does not stop at the same tooth position of previous stopping until the driven pulley 12 rotates 199 times. Accordingly, the number of the 199 rotation operations of the driven pulley 12 is associated with the position (movement pattern) of each tooth 13a of the belt 13 after each rotation operation, it is assumed that the 199 movement patterns are the manufacturing errors in the movement pattern in which rotation has been performed to each internal tooth 13a of the belt 13, and the amount of deviation of the driven pulley 12 from the reference position F1 at each rotation is regarded as the correction value for each internal tooth 13a, that is, the correction value for each phase (movement pattern) of the belt 13.

It should be noted that an example of graphing the correction value will be described in the following description.

Figure 9:
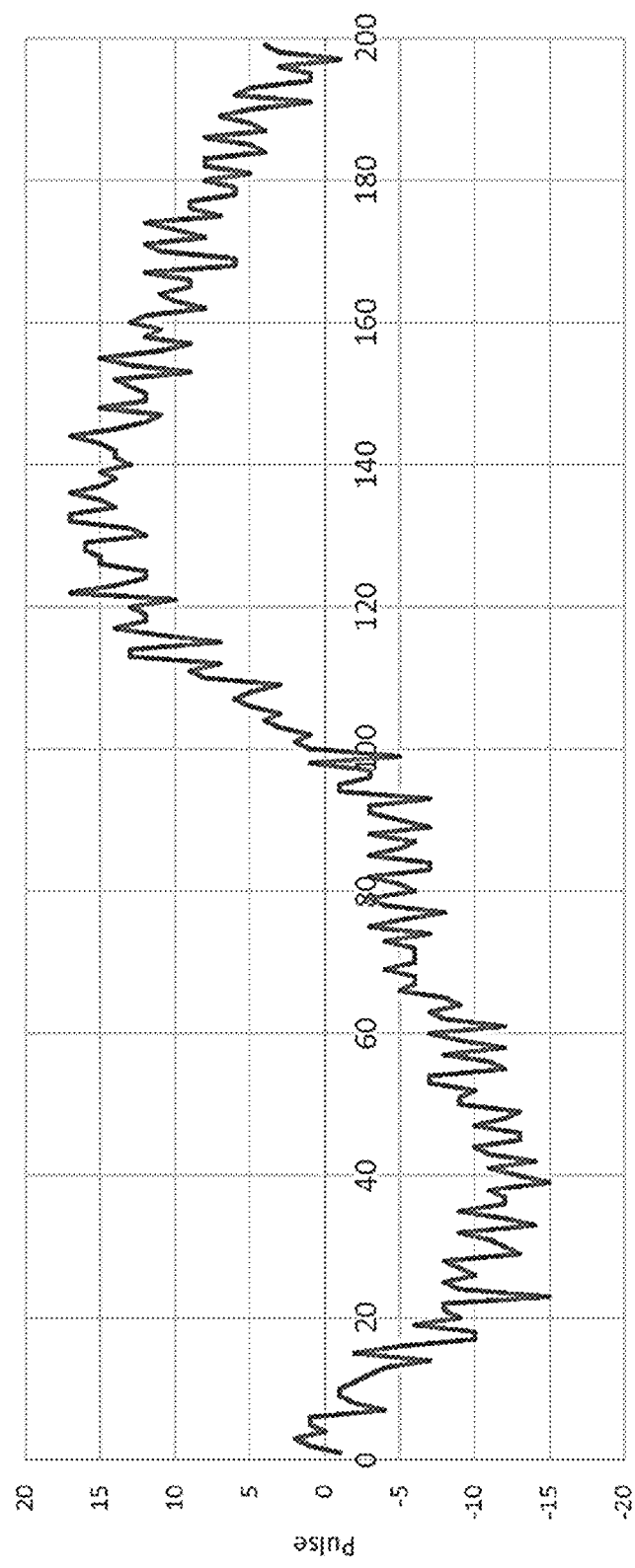
FIG. 9 is a graph of reference detection data detected by the aligner of the present embodiment.
Figure 14:
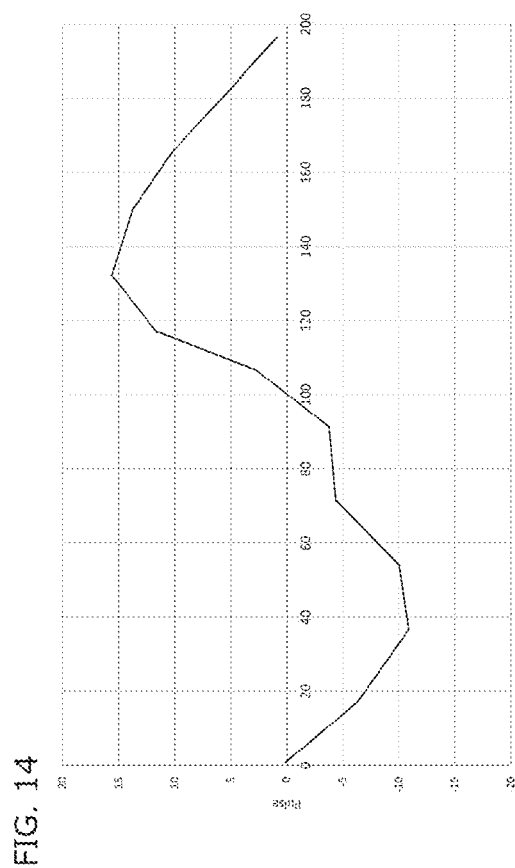
FIG. 14 is a graph showing an approximate straight line of the graph shown in FIG. 9.

FIG. 9 shows the result of the graphing, in which the vertical axis represents each correction value calculated from a series of detection values detected as a result of the operation of the reference value storage step and the detection value storage step and the horizontal axis represents the position numbers of the internal teeth 13a of the belt 13. The graph in FIG. 14 is an approximate straight line-based representation of the graph. It should be noted that the reference detection data is the detection value per rotation detected by the above method or the correction value calculated from the detection value. The pulse number of the spindle driving motor 9 per rotation of the driven pulley 12 is known. Accordingly, when the semiconductor wafer W is actually aligned, the semiconductor wafer W is accurately positioned by the spindle driving motor 9 being caused to perform rotation operation corresponding to this correction value (pulse number) with respect to the detection data of the semiconductor wafer W on the spindle 8.

Next, a reference position calibration method at a time when the pulse information of the spindle driving motor 9 is lost (such as when power is input) will be described. In a case where the spindle driving motor 9 is a stepping motor, the rotation angle information (pulse information) of the stepping motor held by the control unit 14 is reset in the event of power interruption or step-out for some reason and the origin search of the spindle driving motor 9 (origin position return operation) is performed in the event of power input or step-out recovery. However, in the case of the aligner 1 of the present embodiment, the origin search of the spindle driving motor 9 alone is insufficient to recognize whether the positional relationship of the driving pulley 10, the driven pulley 12, and the belt 13 has returned to the reference position at the time when the reference detection data has been acquired. This is because it cannot be confirmed that the position of the belt 13 has returned to the original reference position although the origin sensor is capable of recognizing that the driving pulley 10 has returned to the origin position (reference position). The rotation position at the time of power interruption can be stored as a countermeasure by, for example, an absolute encoder being connected to the output shaft 9a of the spindle driving motor 9. However, absolute encoders are expensive and the connection results in a substantial increase in the manufacturing cost of the aligner 1 as a whole.

In this regard, in the invention, the aligner 1 is operated in the following procedure and first reference position calibration processing for setting a new reference position for specifying the rotation positions of the driving pulley 10, the driven pulley 12, and the belt 13 based on the data detected as a result of the operation is performed. In the calibration processing procedure, the aligner 1 is turned on first and the origin search of the spindle driving motor 9 is performed. At this time, it is assumed that the position of the reference tooth G1 is the position O3 in FIG. 8A. Next, the operation from the detection value storage step to the reference detection data acquisition step is performed. Here, the position of the reference tooth G1 is moved from the position O3 in FIG. 8A to O4 in FIG. 8B by the driven pulley 12 being rotated once. Further, by this operation being performed 199 times in total, the reference tooth G1 sequentially stops at the positions of the 199 internal teeth 13a. As a result of this operation, 199 detection data are acquired with respect to every combination of the positional relationship of the driving pulley 10, the driven pulley 12, and the belt 13. The data detected here (detection data for calibration) is compared and collated with the above-described reference detection data acquired during shipment or the like, the current rotation positions (phases) of the driving pulley 10, the driven pulley 12, and the belt 13 are specified, and the correction value that matches this phase is applied as the correction value of the current rotation position.

As for the collation between the newly detected calibration detection data and the reference detection data initially detected from the reference position, each of the 199 measurement values can also be individually collated. However, it is desirable to extract the measurement values for a predetermined number of times of each graph of the original reference detection data and the newly measured calibration detection data, obtain the slope of the graph, specify the phase that matches the slope of the original data, and use this position as the current rotation position. It should be noted that the least squares method or a method for obtaining an approximate straight line and a regression line is desirable as the method for calculating the slope from each data.

When power has been re-input in the above method, the process of detecting the position of the driven pulley 12 199 times per rotation of the driven pulley 12 has been performed as in the case of the process of acquiring the original reference detection data. Accordingly, it takes a lot of time to rotate the driven pulley 12 199 times and detect the position at each rotation. Other reference position calibration methods in this regard include more quickly returning the aligner 1 to the reference position by reducing the number of calibration detection data acquisitions to the extent that collation can be performed with the slope of the graph of the original reference detection data. This will be described below, with reference to FIG. 17, as a second reference position calibration method.

Figure 19A:
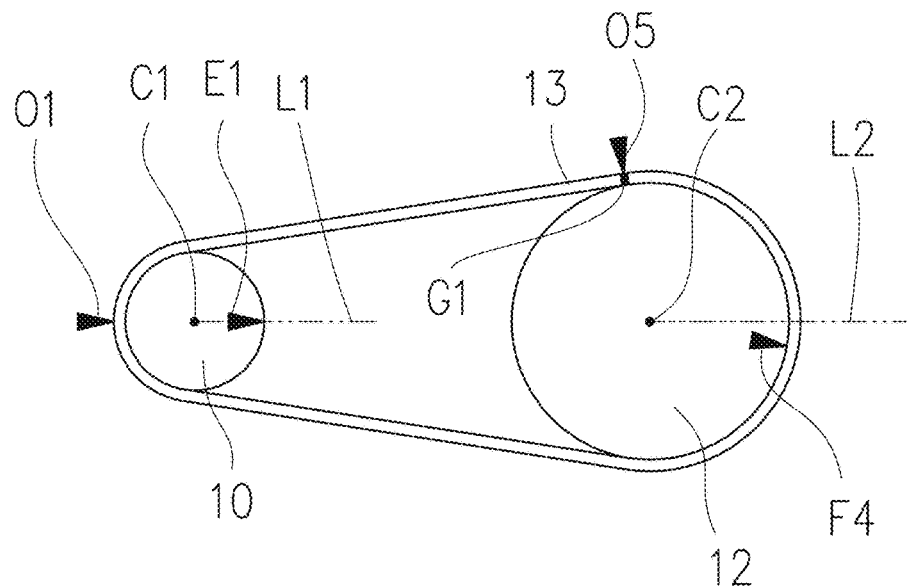
FIGS. 19A and 19B are is schematic diagrams illustrating the operation of the aligner of the present embodiment.
Figure 19B:
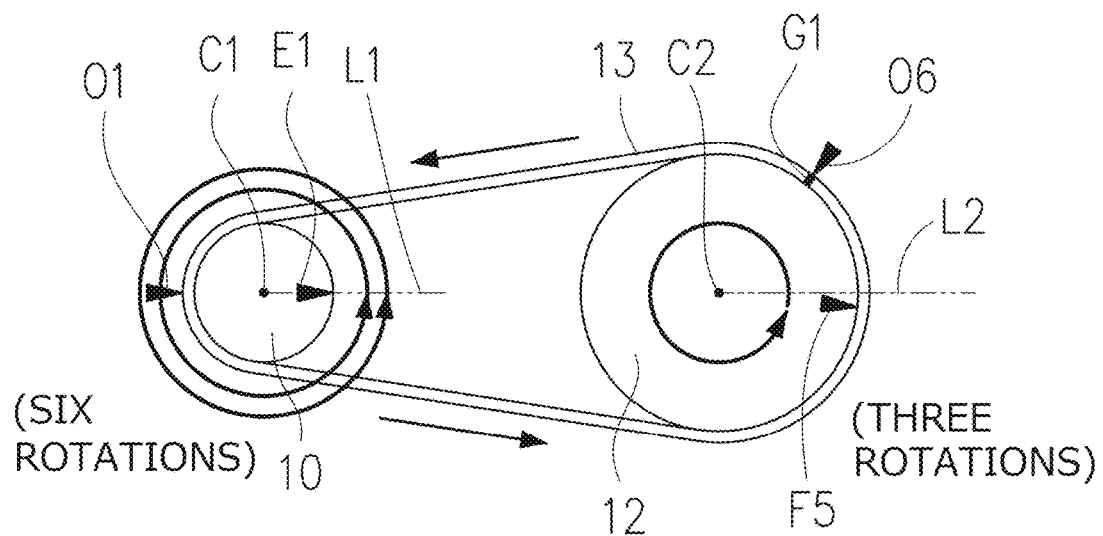

In the second reference position calibration method, the rotation position during the origin search is specified by the second reference position detection unit 31 and the calibration rotation position detection unit 32 being provided and collation being performed with the reference detection data. As for the processing procedure, the aligner 1 is turned on first, and then the second reference position detection unit 31 searches for the origin of the spindle driving motor 9. As a result of this origin search operation, the driven pulley 12 stops at a position F4 deviated from the reference position F1 whereas the driving pulley 10 stops at the reference position E1. Here, the rotation position of the driven pulley 12 immediately after the origin search is detected by the pulley detection sensor 20 and the detected value is stored (calibration reference position storage step: Step 5). It is assumed that the reference tooth G1 at this time is at a position O5 in FIG. 19A. Next, the calibration rotation position detection unit 32 further operates the spindle driving motor 9 and rotates the driving pulley 10 exactly six times in order to rotate the driven pulley 12 three times. Here, the reference tooth G1 moves to the position of a position O6 in FIG. 19B. In addition, the driven pulley stops at the position of F5. The pulley detection sensor 20 detects the rotation position of the driven pulley 12 after the rotation operation of the driving pulley 10 and stores the detected value. Next, the calibration rotation position detection unit 32 repeats the above operation until a predetermined number of detection values (for example, 19 detection values) can be acquired and stores the detection value for each detection operation (calibration detection value storage step: Step 6).

It should be noted that the calibration rotation position detection unit 32 also stores the rotation angle information of the spindle driving motor 9 at the time of the detection in storing the detection value of the driven pulley 12. Then, the calibration graph creation unit 33 creates a graph in which the vertical axis represents the detection value of the rotation position of the driven pulley 12 by the rotational driving of the driving pulley 10 and the horizontal axis represents the temporary number assigned to the internal teeth 13a of the belt 13, obtains an approximate straight line of the graph per 19 rotations from this graph, performs graphing, and obtains the slope of each part of the graph (calibration reference detection data acquisition step: Step 7). Then, the phase specifying unit 34 compares the slopes of parts of the approximate straight line graph of the reference detection data created in the reference detection data acquisition step by the graph creation unit 30 and the approximate polygonal line graph of the calibration detection data created in the calibration reference detection data acquisition step by the calibration graph creation unit 33 and confirms the position that matches the reference detection data as the current phase (current position out of 199) of the belt 13 (phase specifying step: Step 8). Then, a correction value adapting to the current phase of the belt 13 is selected and applied as the correction value of the driven pulley 12.

Here, the belt 13 included in the aligner 1 according to one embodiment of the invention has the 199 teeth, the driving pulley 10 has the 30 teeth, the driven pulley 12 has the 60 teeth, and thus the driven pulley 12 rotates three times every time the driven pulley 12 is rotated six times, that is, every time the belt 13 is extended by 180 teeth. Since the number of the teeth of the belt 13, 199, is a prime number, the belt 13 having an error stops at a position (phase) different from the position of previous stopping in the 199 rotation cycles. As a result, the pulley detection sensor 20 is capable of acquiring a detection value corresponding to the amount of misalignment of the driven pulley 12 at different positions out of the 199 of the belt 13. It should be noted that the acquisition of the calibration detection data may be to the extent that the slope of the measurement value can be calculated from the acquired detection data. In the aligner 1 of the present embodiment, detection per 180-teeth extension (three driven pulley rotations) is performed 19 times. The 19 detections is because detection data for every 180 teeth (three rotations) allows data having little bias and relatively wide in range to be uniformly acquired despite the 19 detections whereas the data that can be acquired is biased to a specific narrow region of the internal teeth 13a and no data can be acquired with uniformity with regard to the 199 internal teeth 13a of the belt in a case where the detection is performed at every 60-teeth extension, which is one driven pulley rotation, and the number of detections is approximately 19. Further, although detection for every 240-teeth advance may replace the detection for every 180-teeth advance, in the case of the belt 13 having the 199 teeth, the 240-teeth advance means that the belt 13 advances by 41 teeth after one rotation and the time for one rotation is wasted. In this regard, from the viewpoint of time saving, it is desirable that the number of rotations of the driven pulley 12 is limited to the number of rotations at which the belt 13 does not rotate once or more. What is important here is that the detection is performed at every advance equivalent to a positive multiple of the number of the teeth of the driven pulley 12.

Figure 13:
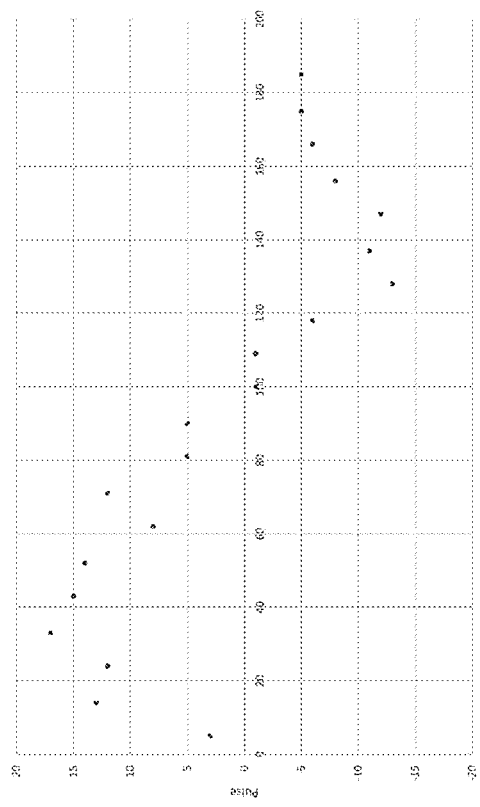
FIG. 13 is a graph showing a detection value detected every time the reference tooth G1 advances by 180 teeth.

FIG. 12 is a table showing the positions of the internal teeth 13a of the belt 13 per 180-teeth advance of the driven pulley 12. FIG. 12 shows, as an example, a time when the reference tooth G1 after the origin search is at the position of the 100th internal tooth 13a of the belt 13. As shown in the table, the belt 13 advances by 180 teeth every time the driven pulley 12 advances by 180 teeth and the same internal tooth 13a does not stop at the reference position O1 until this is repeated 199 times. Accordingly, the position (phase) of the belt 13 and the rotation position of the driven pulley 12 per three rotations are almost uniquely determined despite the 19 detections. Once the position (phase) of the belt 13 is determined, the position of the driven pulley 12 can be specified, and thus the correction value that is applied to the driven pulley 12 is also determined. FIG. 13 is a graph showing the detection value of the calibration detection data detected by the driven pulley 12 being rotated by 180 teeth, that is, the driven pulley 12 being rotated three times. Here, the position of the driven pulley 12 is detected 19 times on the assumption that the position of the reference tooth G1 at the initiation of the detection is the 100th tooth. It should be noted that the detected values are sorted in ascending order with regard to the reference tooth G1 position of the belt 13 and then turned into a graph in which the horizontal axis represents the position of the internal tooth 13a to which the reference tooth G1 has moved and the vertical axis represents the detection value and yet the detected values may be displayed, without being sorted in ascending order, as a scatter plot in which the horizontal axis represents the position of the reference tooth G1.

The slope of the graph displayed from this detection data is obtained, and the slope of this graph is collated with the slope of the graph of the reference detection data. FIG. 14 is a graph obtained by an approximate straight line being calculated from the graph of the reference detection data in FIG. 9. The rotation position of the belt 13 is specified by collation of the part where the slope of the graph in FIG. 14 and the slope of the graph of the detection value of the calibration detection data shown in FIG. 13 match. It should be noted that the method for obtaining the approximate line that is used in the specific method of the invention may be a method for obtaining an approximate curve by polynomial approximation or moving average or a method for obtaining a regression curve by the least squares method.

Figure 15:
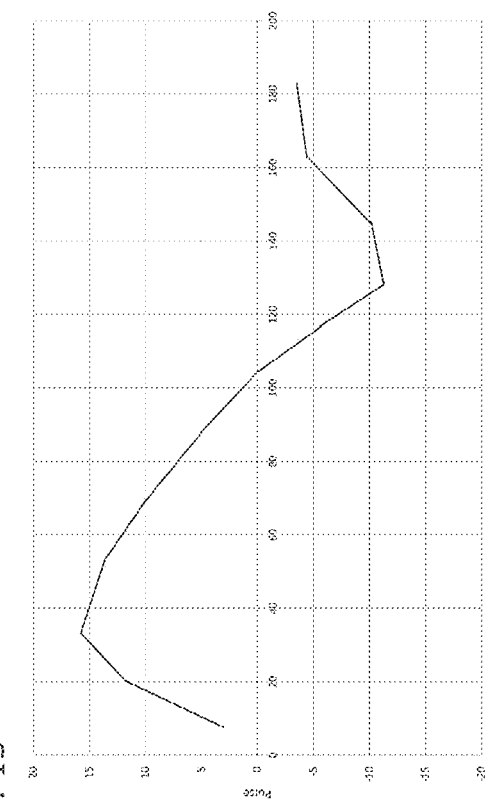
FIG. 15 is a graph showing an approximate straight line of the graph shown in FIG. 13.

FIG. 15 is a graph showing an approximate straight line calculated from the detection value of the calibration detection data shown in FIG. 12. Here, the horizontal axis of the graph displayed in FIG. 14 represents the position of the internal tooth 13a to which the reference tooth G1 has moved for each detection and the horizontal axis of the graph displayed in FIG. 15 represents the position of the internal tooth 13a to which the reference tooth G1 has moved for each detection on the assumption that the position of the reference tooth G1 after the origin search is at the position of the 100th internal tooth 13a. In addition, the vertical axes of FIGS. 14 and 15 represent the amount of misalignment of the driven pulley 12 with regard to each of the internal teeth 13a converted into a pulse. Comparing the slopes of the graphs of FIG. 14 showing the reference detection data and FIG. 15 showing the calibration detection data, it can be seen that the slope of the graph from rotation number 5 to 24 on the horizontal axis of FIG. 15 showing the calibration detection data and the slope of the graph from 61 to 80 on the horizontal axis correspond to the slopes of the graphs from 104 to 123 and 160 to 179 on the horizontal axis of the reference detection data in FIG. 14, respectively. As a result, it can be confirmed as to the positional relationship of the driving pulley 10, the driven pulley 12, and the belt 13 after the origin search of the spindle driving motor 9 following power restoration that the belt 13 is in the phase of 99-teeth advance from the reference position, that is, in the phase 100-teeth behind although the driving pulley 10 and the driven pulley 12 have returned to the reference position.

Since the phase of the belt 13 has been confirmed by the above method, the control unit 14 compares the stored correction value with the current phase of the belt 13 and replaces the correction value in the current phase of the belt 13 with the current correction value. The calibration operation of the belt 13 is completed by the correction value replacement operation of the control unit 14. It should be noted that the previously unknown phase of the belt 13 is now confirmed and thus, in addition to the method for replacing the correction value described above, the driving pulley 10 may be rotated a predetermined number of times until the driving pulley 10 is rotated and the positional relationship of the driving pulley 10, the driven pulley 12, and the belt 13 returns to the state at the time of reference detection data acquisition.

Further, although the position of the driven pulley 12 is calculated by the detection of the state where the optical axis of the pulley detection sensor 20 is shaded by the dog 21 provided on the driven pulley 12 of the aligner 1 in the reference position calibration method described above, the invention is not limited thereto. For example, the invention is sufficiently applicable even to the aligner 1 that lacks means for detecting the rotation position of the driven pulley 12. Next, a correction method in the aligner 1 that lacks the means for detecting the position of the driven pulley 12 will be described. In the aligner 1 of the present embodiment, the semiconductor wafer W and the alignment sensor 19 are used as means for detecting the rotation position of the driven pulley 12.

It should be noted that the number of the external teeth of the driving pulley 10 is 30, the number of the external teeth of the driven pulley 12 is 60, and the number of the internal teeth of the belt 13 is 199 in the aligner 1 of the present embodiment as well as the aligner 1 of the first embodiment described above. First, the spindle driving motor 9 of the aligner 1 of the present embodiment is operated and the origin search is performed. Next, the semiconductor wafer W is placed by means of a jig or the like such that the rotation center axis C2 of the spindle 8 and the center position of the semiconductor wafer W match and the semiconductor wafer W on the spindle 8 is fixed to the spindle 8 by the holding means of the aligner 1 (fixing step). Next, the spindle driving motor 9 is operated, the notch N of the semiconductor wafer W is detected by the alignment sensor 19, and this detected value is stored in the control unit 14 as a reference position detection value (second reference value storage step). Next, predetermined operation for rotating the driven pulley 12 once is performed on the spindle driving motor 9, the operation of detecting the notch N of the semiconductor wafer W with the alignment sensor 19 is repeated until the driving pulley 10, the driven pulley 12, and the belt 13 return to the respective reference positions thereof without exception, and the detection value of the alignment sensor 19 per rotation of the driven pulley 12 and the rotation angle information (pulse) of the spindle driving motor 9 at the time when the notch N is detected by the alignment sensor 19 are stored in the control unit 14 (second detection value storage step).

In addition, a correction value for correcting the misalignment of the driven pulley 12 per rotation is calculated from the detection value of the alignment sensor 19 (second correction value calculation step). Then, a graph is created in which the vertical axis represents the notch detection value for 199 rotations of the semiconductor wafer W corresponding to the rotation position for 199 rotations of the driven pulley 12 resulting from the rotational driving of the driving pulley 10 and the horizontal axis represents the number assigned to each internal tooth 13a formed on the belt 13 and the reference detection data is acquired by an approximate straight line and the slope thereof per predetermined range of the graph being calculated (second reference detection data acquisition step).

Then, in the event of power restoration or step-out recovery, the origin search is performed once, the origin position return operation of the spindle driving motor 9 is performed, and then the spindle driving motor 9 is operated with the semiconductor wafer W held on the spindle 8, the notch N of the semiconductor wafer W is detected by the alignment sensor 19, and the detection value of the alignment sensor 19 and the rotation angle information (pulse) of the spindle driving motor 9 at the time when the notch N is detected by the alignment sensor 19 are stored in the control unit 14 (second calibration reference position storage step). Next, the spindle driving motor 9 is operated, the driving pulley 10 is rotated exactly six times so that the semiconductor wafer W on the spindle 8 rotates three times, the notch N of the semiconductor wafer W after the rotation operation of the driving pulley 10 is detected by the alignment sensor 19, and the detected value is stored in the control unit 14.

Next, the operation of Step 15 is repeated until a predetermined number of detection values can be acquired and the detection value for each detection operation is stored in the control unit 14 (second calibration detection value storage step). Then, a graph is created in which the vertical axis represents the detection value of the notch N of the semiconductor wafer W resulting from the rotational driving of the driving pulley 10 and the horizontal axis represents the position of the internal tooth 13a to which the reference tooth G1 has moved for each detection. The approximate straight line of the graph for each predetermined rotation is obtained from this graph and graphing is performed (second calibration reference detection data acquisition step). Then, the slopes of the approximate straight line graph of the reference detection data created in the second reference detection data acquisition step and the approximate straight line graph of the calibration detection data created in the second calibration reference detection data acquisition step are compared and the current phase of the belt 13 is specified (second phase specifying step). Then, a correction value adapting to the current phase of the belt 13 is selected and applied as the correction value of the driven pulley 12. As a result of the above procedure, an accurate correction value at a time of wafer alignment can be applied even to the aligner 1 that lacks the pulley detection sensor 20.

Figure 10:
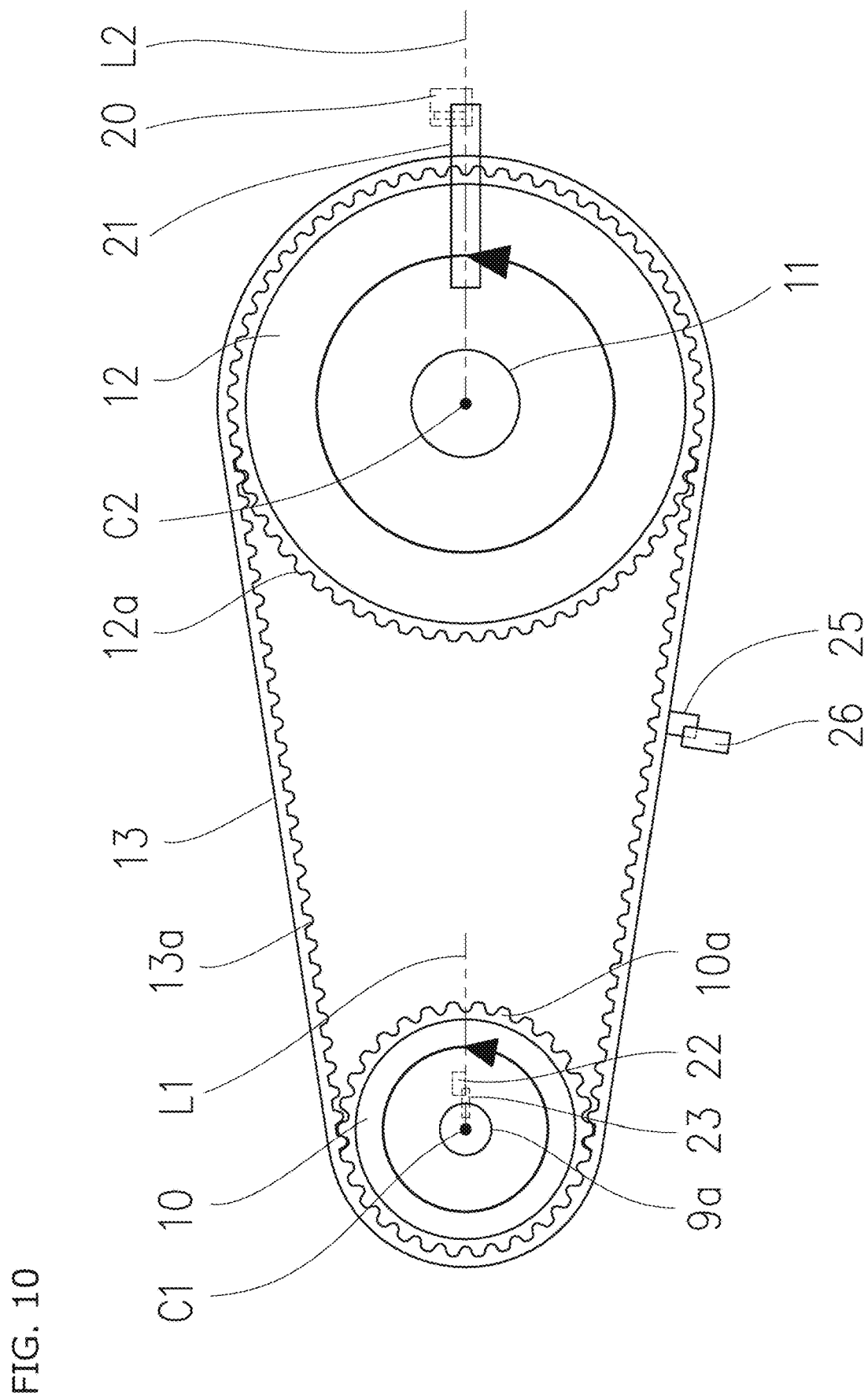
FIG. 10 is a diagram illustrating another embodiment of the invention.

In addition, the driving pulley 10, the driven pulley 12, and the belt 13 can be returned to the reference positions by means of a configuration as an alternative to the method described above in which the position of the belt 13 in the direction of rotation is detected by a mark 25 being provided on the belt 13 of the aligner 1 and a belt detection sensor 26 detecting the mark 25 being provided in the vicinity of the belt 13 as illustrated in FIG. 10. Various forms can be applied to the mark 25 and the belt detection sensor 26. For example, the belt detection sensor 26 may be a transmitted light-type sensor and the mark 25 may be a protrusion blocking the optical axis. Alternatively, the belt detection sensor 26 may be a reflected light-type sensor and the mark 25 may reflect the optical axis. In addition, it is desirable that the mark 25 is smaller in dimension than the specified size P3 of the internal tooth 13a. By adding the above configuration, it is possible to recognize that the pulley detection sensor 20, the origin sensor 22, and the belt detection sensor 26 have returned to the reference position without exception at a reaction time point by operating the spindle driving motor 9 after the origin return of the spindle driving motor 9 and continuously rotating the driving pulley 10.

Hereinbefore, although the embodiments of the invention have been described in detail with reference to the drawings, the invention is not limited to the above-described embodiments and can be, for example, modified within the gist of the invention. For example, although the number of the internal teeth 13a of the belt 13 is a multiple of 199 in the above description, the invention is not limited thereto, the number may be a prime number such as 163 and 223, and the invention is applicable even when the number is a non-prime number. Further, although the number of the external teeth 10a of the driving pulley 10 is 30 and the number of the external teeth 12a of the driven pulley 12 is 60 in the above description, the invention is not limited thereto. In addition, the invention is sufficiently applicable even when the rotation ratios of the driving pulley 10 and the driven pulley 12 are not positive multiples.

The invention claimed is:

1. A correction value calculation method for an aligner including a motor allowing rotation angle control, a driving pulley provided with external teeth driven by the motor, a driven pulley provided with external teeth configured at a predetermined rotation ratio with respect to the driving pulley, a toothed belt comprising a prime number of internal teeth meshing with the driving pulley and the driven pulley and hung between the driving pulley and the driven pulley, a spindle concentrically fixed to the driven pulley and having fixing means for fixing a semiconductor wafer, an alignment sensor detecting a peripheral edge of the semiconductor wafer fixed on the spindle, a pulley detection sensor provided with a light projecting portion and a light receiving portion, detecting a rotation position of the driven pulley at a time when the driving pulley is driven by the motor and the driven pulley is rotated once as the amount of light received by the light receiving portion, and outputting a magnitude thereof as a detection value, and a control unit provided with an input-output unit, a calculation unit, and a storage unit and controlling operation of each of the units, the correction value calculation method being for calculating a correction value for correcting misalignment in a direction of rotation of the driven pulley attributable to a manufacturing error of the toothed belt by means of the control unit and comprising:
   a reference value storage step of detecting the rotation position of the driven pulley at a time when each of the driving pulley, the driven pulley, and the toothed belt is at a respective predetermined reference position at a same time by means of the pulley detection sensor and storing the detected value in the control unit as a reference value;
   a detection value storage step of storing the detection value of the pulley detection sensor in the control unit for each rotation of the driven pulley by executing the operation of rotating the driven pulley once repeatedly until each of the driving pulley, the driven pulley, and the toothed belt return to the respective predetermined reference position at the same time;
   a correction value calculation step of calculating the correction value for correcting the amount of deviation of the rotation position per rotation of the driven pulley from the amount of change in the detection value stored in the control unit; and
   the detection value storage step is executed the same number of times as the number of the internal teeth provided on the belt.

2. The correction value calculation method for an aligner according to claim 1, wherein the number of the external teeth of the driven pulley is an integer multiple of the number of the external teeth of the driving pulley, the toothed belt is provided with internal teeth.

3. The correction value calculation method for an aligner according to claim 2, wherein the correction value is a control quantity for controlling the rotation angle of the motor.

4. The correction value calculation method for an aligner according to claim 1, comprising a reference detection data acquisition step of acquiring reference detection data by creating a graph in which a vertical axis represents the detection value or the correction value and a horizontal axis represents a number assigned to each internal tooth formed on the toothed belt based on the detection value detected in the reference value storage step and the detection value storage step or the correction value calculated in the correction value calculation step and calculating an approximate straight line for each predetermined range of the graph and a slope thereof.

5. The correction value calculation method for an aligner according to claim 4, further comprising:
   a calibration reference position storage step of performing origin search by operating the motor with rotation angle information lost, detecting the rotation position of the driven pulley after the origin search operation by means of the pulley detection sensor, and storing the detected value in the control unit;
   a calibration detection value storage step of causing the motor to perform rotation operation for rotating the driven pulley a predetermined number of times and then repeating the operation of detecting the rotation position of the driven pulley by means of the pulley detection sensor a predetermined number of times and storing in the control unit a calibration detection value detected by the pulley detection sensor each time the rotation operation is performed;
   a calibration reference detection data acquisition step of creating a graph of the calibration detection value stored in the control unit and calculating a slope for each predetermined detection range of the graph; and
   a phase specifying step of specifying phases of the driving pulley, the driven pulley, and the toothed belt by comparing the graph created in the reference detection data acquisition step with the graph created in the calibration reference detection data acquisition step.

6. An aligner comprising:
   a motor allowing rotation angle control;
   a driving pulley driven by the motor;
   a driven pulley configured at a predetermined rotation ratio with respect to the driving pulley;

a toothed belt comprising a prime number of internal teeth meshing with the driving pulley and the driven pulley and hung between the driving pulley and the driven pulley;

a spindle concentrically fixed to the driven pulley and having fixing means for fixing a semiconductor wafer;

an alignment sensor detecting a peripheral edge of the semiconductor wafer fixed on the spindle;

a pulley detection sensor detecting a rotation position of the driven pulley; and a control unit, wherein in calculating a correction value for correcting misalignment in a direction of rotation of the driven pulley attributable to a manufacturing error of the toothed belt, the control unit includes:

a first reference position detection unit detecting the rotation position of the driven pulley at a time when each of the driving pulley, the driven pulley, and the toothed belt is at a respective predetermined reference position at a same time by means of the pulley detection sensor and storing the reference position detection value;

a rotation position detection unit executing the operation of detecting the rotation position of the driven pulley by means of the pulley detection sensor during an operation for rotating the driven pulley once repeatedly until each of the driving pulley, the driven pulley, and the toothed belt return to the respective predetermined reference position at the same time and storing a rotation position detection value per rotation of the driven pulley;

a correction value calculation unit calculating the correction value for correcting the misalignment per rotation of the driven pulley from the reference position detection value and the rotation position detection value; and the operation of detecting the rotation position of the driven pulley executed by the rotational position detection unit is executed the same number of times as the number of the internal teeth provided on the belt.

7. The aligner according to claim 6, wherein the control unit further includes a graph creation unit creating a graph in which a vertical axis represents the detection value or the correction value and a horizontal axis represents a number assigned to each internal tooth formed on the toothed belt based on the calculated detection value and calculating an approximate straight line for each predetermined detection range of the graph and a slope thereof.

8. The aligner according to claim 7, wherein the control unit includes:

a second reference position detection unit performing origin search by operating the motor with rotation angle information lost, detecting the rotation position of the driven pulley at a time when the driving pulley has returned to its own reference position by means of the pulley detection sensor, and storing the detected value;

a calibration rotation position detection unit causing the motor to repeat a predetermined number of times rotation operation for rotating the driven pulley a predetermined number of times and then detecting the rotation position of the driven pulley by means of the pulley detection sensor and storing the detected value;

a calibration graph creation unit creating a graph of the detection value detected by the calibration rotation position detection unit; and a phase specifying unit calculating a slope for each predetermined detection range of the graph and specifying phases of the driving pulley, the driven pulley, and the toothed belt by comparing the graph created by the graph creation unit with the graph created by the calibration graph creation unit.

9. The aligner according to claim 6, wherein there is no common divisor other than 1 in the number of the internal teeth formed on the toothed belt, the number of the external teeth formed on the driving pulley, and the number of the external teeth formed on the driven pulley.

10. The aligner according to claim 6, wherein the number of the external teeth formed on the driven pulley is an integer multiple of the number of the external teeth formed on the driving pulley.

11. A correction value calculation method for an aligner including a motor allowing rotation angle control, a driving pulley driven by the motor, a driven pulley configured at a predetermined rotation ratio n (n is an integer) with respect to the driving pulley, a toothed belt comprising a prime number of internal teeth meshing with the driving pulley and the driven pulley and hung between the driving pulley and the driven pulley, a spindle concentrically fixed to the driven pulley and having fixing means for fixing a semiconductor wafer, an alignment sensor detecting a peripheral edge of the semiconductor wafer fixed on the spindle, a pulley detection sensor detecting a rotation position of the driven pulley, and a control unit, the correction value calculation method being for correcting misalignment in a direction of rotation of the driven pulley attributable to a manufacturing error of the toothed belt, wherein the control unit rotates the driving pulley n times by means of the motor, detects the rotation position of the driven pulley by means of the pulley detection sensor for each of the rotation operations, executes the operation of detecting the rotation position of the driven pulley by means of the pulley detection sensor for each of the rotation operations of the driven pulley by the number of internal teeth formed on the toothed belt, and calculates, from a detection value detected by the pulley detection sensor, a correction value corresponding to the detection value of each rotation of the driven pulley, as a correction value corresponding to each rotation position of the toothed belt, and the detection value storage step is executed the same number of times as the number of the internal teeth on the belt.

12. The correction value calculation method for an aligner according to claim 11, wherein reference detection data is acquired by a graph in which a vertical axis represents the detection value or the correction value and a horizontal axis represents a number assigned to each internal tooth formed on the toothed belt being created based on each of the detection values and an approximate curve for each predetermined range of the graph and a slope thereof being calculated.

13. The correction value calculation method for an aligner according to claim 12, wherein in a case where rotation angle information is lost, origin search is performed by the motor being operated, the rotation position of the driven pulley after the origin search operation is detected by means of the pulley detection sensor, subsequently the motor is caused to perform rotation operation for rotating the driven pulley a predetermined number of times, the rotation position of the driven pulley is detected by means of the pulley detection sensor, a graph of the detection value after the origin search is created, and then a slope is calculated for each predetermined detection range of the graph, and calibration detection data for specifying phases of the driving pulley, the driven pulley, and the toothed belt is acquired by the slope of the graph after the origin search being compared with a slope of a graph of the reference detection data.

* * * * *